(12) United States Patent
Winter

(10) Patent No.: US 11,961,712 B2
(45) Date of Patent: Apr. 16, 2024

(54) COMBINING THE DETERMINATION OF SINGLE AND MUTUAL, PRESET PRESERVING, IMPEDANCE LOADS WITH ADVANCES IN SINGLE AND DOUBLE SENSOR CALIBRATION TECHNIQUES IN THE APPLICATION OF SINGLE AND PAIRWISE CALIBRATION OF SENSORS

(71) Applicant: Advanced Energy Industries, Inc., Fort Collins, CO (US)

(72) Inventor: Frederick Winter, San Jose, CA (US)

(73) Assignee: Advanced Energy Industries, Inc., Denver, CO (US)

(*) Notice: Subject to any disclaimer, the term of this patent is extended or adjusted under 35 U.S.C. 154(b) by 527 days.

(21) Appl. No.: 17/240,139

(22) Filed: Apr. 26, 2021

(65) Prior Publication Data

US 2022/0375718 A1 Nov. 24, 2022

(51) Int. Cl.
*H01J 37/32* (2006.01)

(52) U.S. Cl.
CPC .............. *H01J 37/32183* (2013.01)

(58) Field of Classification Search
CPC ....... H01J 37/32; H01J 37/32183; H03H 7/38
USPC ............................................... 333/17.3, 17.1
See application file for complete search history.

(56) References Cited

U.S. PATENT DOCUMENTS

| | | | |
|---|---|---|---|
| 7,049,751 B2 | 5/2006 | Blackburn et al. | |
| 7,122,965 B2 | 10/2006 | Goodman | |
| 7,403,764 B2 * | 7/2008 | Turner | H01J 37/3299 455/248.1 |
| 7,794,615 B2 * | 9/2010 | Ogawa | H01J 37/3299 216/61 |
| 9,478,397 B2 | 10/2016 | Blackburn et al. | |
| 9,663,858 B2 | 5/2017 | Nagami et al. | |
| 2006/0116106 A1 | 6/2006 | Turner | |
| 2006/0220574 A1 | 10/2006 | Ogawa | |
| 2007/0236148 A1 | 10/2007 | Yamazawa et al. | |
| 2009/0066438 A1 | 3/2009 | Kim et al. | |
| 2011/0234201 A1 | 9/2011 | Tanaka et al. | |
| 2015/0096684 A1 | 4/2015 | Nagami et al. | |

FOREIGN PATENT DOCUMENTS

| | | |
|---|---|---|
| CN | 106169410 A | 11/2016 |
| EP | 2068441 B1 | 4/2011 |
| JP | 4838525 B2 | 12/2011 |
| WO | 2013003205 A1 | 1/2013 |

OTHER PUBLICATIONS

Boris Cetinich, International Search Report and Written Opinion, Australian Patent Office, dated Jun. 30, 2020, Australia.
WIPO, International Preliminary Report on Patentability regarding PCT/US2022/025692, dated Nov. 9, 2023, p. 6.

* cited by examiner

*Primary Examiner* — Hai L Nguyen
(74) *Attorney, Agent, or Firm* — Neugeboren O'Dowd PC

(57) ABSTRACT

This disclosure describes systems, methods, and apparatus for calibrating sensors used by a match network during tuning of power delivery to a plasma processing chamber. The calibration can include self-calibration of two sensors in isolation relative to a self-load, and Relative or Absolute mutual calibration of both sensors used together across a mutual load. The mutual calibration can determine errors between the two sensors after they are each calibrated in isolation, and this additional calibration provides previously unrealized tuning accuracy.

20 Claims, 25 Drawing Sheets

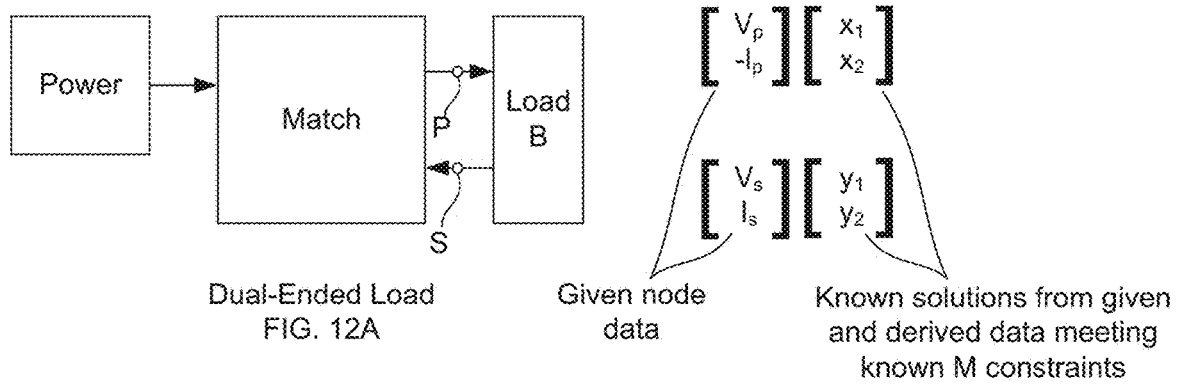
Dual-Ended Load
FIG. 12A
Given node data
Known solutions from given and derived data meeting known M constraints
Physical Illustration
---
Theoretical Illustrations
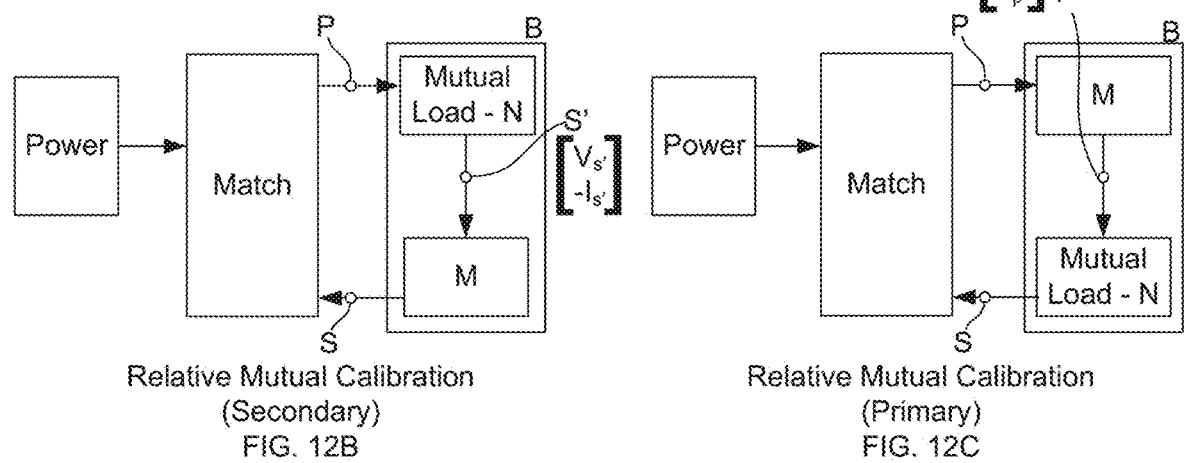
Relative Mutual Calibration (Secondary)
FIG. 12B
Relative Mutual Calibration (Primary)
FIG. 12C
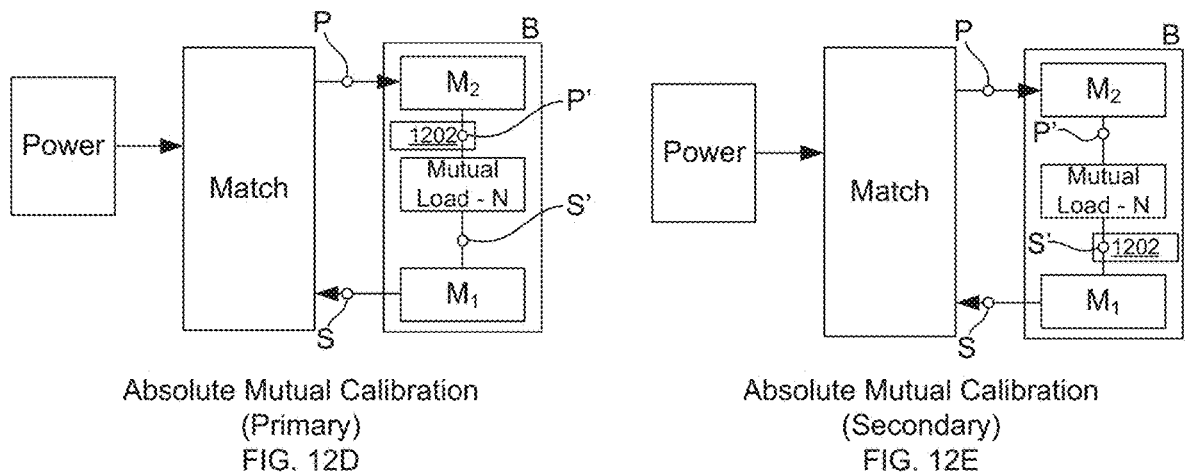
Absolute Mutual Calibration (Primary)
FIG. 12D
Absolute Mutual Calibration (Secondary)
FIG. 12E
FIG. 12

COMBINING THE DETERMINATION OF SINGLE AND MUTUAL, PRESET PRESERVING, IMPEDANCE LOADS WITH ADVANCES IN SINGLE AND DOUBLE SENSOR CALIBRATION TECHNIQUES IN THE APPLICATION OF SINGLE AND PAIRWISE CALIBRATION OF SENSORS

FIELD OF THE DISCLOSURE

This disclosure relates generally to an apparatus for matching the variable impedance of a load, and more particularly to apparatus and methods for RF power delivery systems for plasma processing.

DESCRIPTION OF RELATED ART

In plasma processing applications, such as the manufacture of semiconductors or flat panel displays, RF power generators apply a voltage or current to an impedance load in a plasma chamber or otherwise and may operate over a wide range of frequencies. The impedance load can either be a plasma or a substrate within the chamber, and the chamber can be configured for plasma deposition of thin films on the substrate or for etching material from the substrate. A match network can be arranged between an RF power generator and the load and can be designed to provide an efficient transfer of power from the RF power generator to the plasma load in the chamber by matching the different impedances between the generator and the plasma load at the fundamental frequency of the RF power generator. Sensors can be arranged at outputs of the match network to monitor the delivery of power and these sensors can be employed to tune the match to optimize power delivery to the plasma processing chamber. As such, the match network can be operated such that its variable elements are adjusted according to voltage and current measured by the sensors.

Although it would be preferred to use highly accurate reference sensors in the field, these sensors tend to be too expensive, and thus lower-cost sensors needing calibration are typically used in a match network. Known calibration, or "Self-Calibration," can be performed for single-output systems (see FIG. 3) or dual-output systems (see FIGS. 4 and 5). In either case, a sensor is calibrated by applying a test signal from the matching circuit to a sensor being calibrated and a reference sensor or "Standard" using a real wave impedance of $R_0$ ohm (Standard and reference sensor are used interchangeably throughout this disclosure). The Standard is coupled between the sensor being calibrated and a "self-load." The test signal can be generated by a reference RF power generator. The sensor being calibrated and the Standard essentially measure the same electrical node in the system—measuring an identical voltage or current. However, since the Standard is a more costly and higher-accuracy sensor, there is often an error between measurements made by the sensor being calibrated and the Standard. This error can be measured and stored as a self-calibration matrix in the match network's memory. When the match network is sent into the field, it can make use of this calibration matrix (i.e., the calibrated sensor operates as if taking voltage and current measurements using the more expensive Standard).

A similar method can be used to determine calibration of a first of two sensors in a dual-output configuration (see FIGS. 4 and 5). In this case, the Standard can also be coupled between the second sensor and a self-load and a test signal can be passed through the second sensor and the self-load and into ground (see FIG. 5). Again, a self-calibration matrix can be determined to account for errors between the second sensor and the Standard and this matrix can be stored in the match memory and then used during operation of the match network. Thus, match network sensors are calibrated in isolation and assuming a real impedance, $R_0$.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

In this disclosure, the sensors are not only calibrated in isolation (self-calibration), but also relative to each other when used in combination (mutual calibration). Calibration is also performed assuming a complex wave impedance. Specifically, calibration of a set of sensors working in tandem can be broken into five steps: (1) selection of components of a mutual load, corresponding match network presets, and a self-load; (2) self-calibration of the first or primary sensor (i.e., determination of a first calibration matrix, $K_p$) where the self-load is three lab loads; (3) self-calibration of the second or secondary sensor (i.e., determination of a second calibration matrix, $K_s$) where the self-load is three lab loads; (4) mutual calibration of the two calibrated sensors relative to each during operation across a common or mutual load (i.e., determination of a displacement matrix, D in the Relative method, or displacement matrices, $D_1$ and $D_2$, in the Absolute method) where the mutual load is conjugately matched to the impedances associated with the fixed presets maintained in the match at both the match output and the plasma return input; and (5) application of the displacement matrix, D, to either the second self-calibration matrix, $K_s$, to arrive at a modified second self-calibration matrix, $K_{s'}$ or the first self-calibration matrix, $K_p$, to arrive at a modified first self-calibration matrix, $K_{p'}$ (Relative method) or application of the displacement matrices, $D_1$ and $D_2$, to the first and second self-calibration matrices to arrive at two modified self-calibration matrices, $K_{p'}$ and $K_{s'}$ (Absolute method). The calibration matrices can be stored in match memory, and the match can be sent to an operation site and used between an RF generator and a plasma load where the first and second sensors are used with their respective calibration matrices. Further, since calibration is performed assuming a complex impedance, the match network can accurately operate over a wide range of impedance values.

Some embodiments of the disclosure may be characterized as a match network configured for impedance matching a radio frequency (RF) power generator to a plasma processing chamber. The match network comprises a match input, an output, a plasma return input, a first sensor, a second sensor, a memory, and a controller. The first sensor is coupled to a first electrical path between the match input and the output. The second sensor is coupled to a second electrical path between the plasma return input and a ground connection. The memory is configured to store a first calibration matrix, $K_1$, a second calibration matrix, $K_2$, and a modified second calibration matrix, $K_{2'}$. The controller is configured to monitor power delivery to the plasma processing chamber via the first and second sensors, wherein data from the first or second sensor is calibrated via the first calibration matrix, $K_1$, and data from the second or first sensor, respectively, is calibrated via the modified second calibration matrix, $K_{2'}$. The modified second calibration matrix, $K_{2'}$, accounts for errors between the first and second sensors when the first and second sensors are calibrated by measuring current and voltage at the output and the plasma return input with a mutual load coupled between the first and second sensors. The first calibration matrix, $K_1$, the second calibration matrix, $K_2$, and the modified second calibration matrix, $K_{2'}$, can all be determined with the match network at the same variable component values. The modified second calibration matrix, $K_{2'}$, accounts for errors between the first and second sensors after the first sensor is calibrated in isolation against a primary self-load to give the first calibration matrix, $K_1$, and the second sensor is calibrated in isolation against a secondary self-load to give the second calibration matrix, $K_2$. The first calibration matrix, $K_1$, accounts for errors between measurements of the first sensor and a reference sensor when both the first sensor and the reference sensor are measuring current and voltage delivered through the match network via the output to the primary self-load.

Other embodiments of the disclosure may also be characterized as match network configured for impedance matching a radio frequency power generator to a plasma processing chamber. The match network includes a match input, an output, a plasma return input, a first sensor, a second sensor, a memory, and a controller. The first sensor couples to a first electrical path between the match input and the output, and the second sensor couples to a second electrical path between the plasma return input and a ground connection. The memory is configured to store a first calibration matrix, $K_1$, a second calibration matrix, $K_2$, a first modified calibration matrix, $K_{1'}$, and a second modified calibration matrix, $K_{2'}$. The controller is configured to monitor power delivery to the plasma processing chamber via the first and second sensors, wherein data from the first sensor is calibrated via a first modified calibration matrix, $K_{1'}$, and data from the second sensor is calibrated via a second modified calibration matrix, $K_{2'}$. The modified first calibration matrix, $K_{1'}$, and the modified second calibration matrix, $K_{2'}$, account for errors between the first and second sensors when the first and second sensors are individually calibrated via a reference sensor and a self-load, and then mutually calibrated against each other via (1) measurements of current and voltage at the match output by the first sensor and the reference sensor or (2) measurements of current and voltage at the plasma return input by the second sensor and the reference sensor. The first calibration matrix, $K_1$, the second calibration matrix, $K_2$, and the modified second calibration matrix, $K_{2'}$, can all be determined with the match network at the same variable component values. The modified second calibration matrix, $K_{2'}$, accounts for errors between the first and second sensors after the first sensor is calibrated in isolation against a primary self-load to give the first calibration matrix, $K_1$, and the second sensor is calibrated in isolation against a secondary self-load to give the second calibration matrix, $K_2$. The first calibration matrix, $K_1$, accounts for errors between measurements of the first sensor and a reference sensor when both the first sensor and the reference sensor are measuring current and voltage delivered through the match network via the output to the primary self-load.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

FIG. 12A illustrates a plasma processing system comprising a power supply, a match network, and a plasma load;

FIG. 12B is a theoretical illustration of a system used to perform Relative calibration on sensors in a match network using a mutual load represented by matrix N and an error model M;

FIG. 12C is a theoretical illustration of another system used to perform Relative calibration on sensors in a match network using a mutual load represented by matrix N and an error model M;

FIG. 12D is a theoretical illustration of a system used to perform Absolute calibration on sensors in a match network using a mutual load represented by matrix N, a reference sensor, and two error models, $M_1$ and $M_2$;

FIG. 12E is a theoretical illustration of another system used to perform Absolute calibration on sensors in a match network using a mutual load represented by matrix N, a reference sensor, and two error models, $M_1$ and $M_2$;

DETAILED DESCRIPTION

Figure 1:
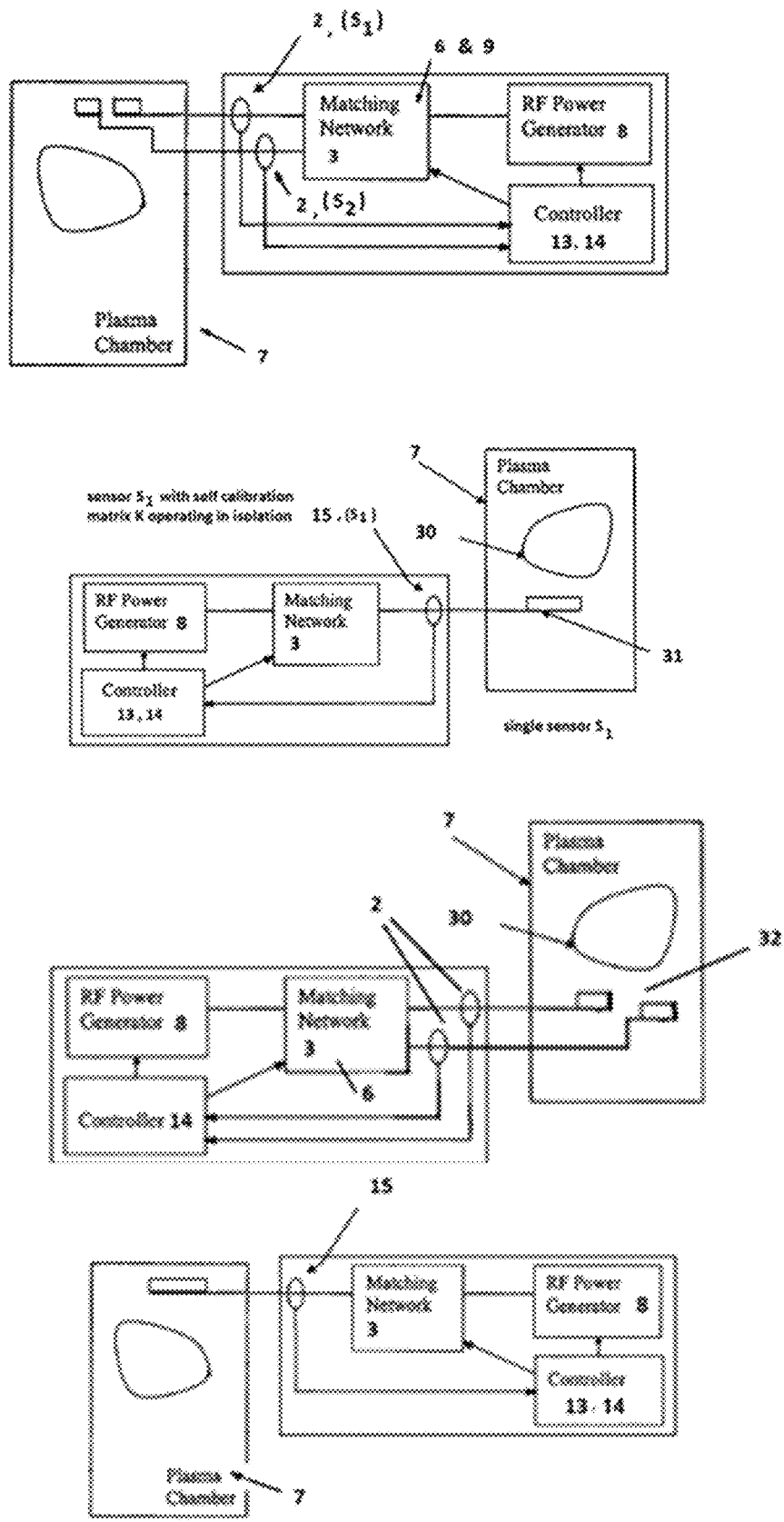
FIG. 1 illustrates non-limiting examples of RF power generators, match networks, and plasma processing chambers.

The present disclosure relates generally to match networks for plasma processing. More specifically, but without limitation, the present disclosure relates to calibrating sensors used to control match network tuning.

Preliminary note: the flowcharts and block diagrams in the following Figures illustrate the architecture, functionality, and operation of possible implementations of systems, methods and computer program products according to various embodiments of the present disclosure. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

The word "exemplary" is used herein to mean "serving as an example, instance, or illustration." Any embodiment described herein as "exemplary" is not necessarily to be construed as preferred or advantageous over other embodiments.

For the purposes of this disclosure, a "mutual impedance load" or "mutual load" is one that is connected between a pair of sensors and where current passes through a first of the two sensors, then through the mutual load, and then back into the match network through the plasma return input. The mutual load is a set of reactive and resistive components configured to replicate a plasma load.

For the purposes of this disclosure, a "mutual calibration" for a pair of sensors gives a set of calibration matrices, or an array of sensor calibration parameters, that not only correct for errors between each of the two sensors individually against a reference sensor arranged at the same electrical node, but also correct for errors between the two sensors after they are individually calibrated off the reference sensor. In other words, even after a sensor is calibrated off the reference sensor, when used in a mutual load situation, those calibrated sensors see additional errors relative to each other. Hence, mutual calibration addresses these additional errors.

For the purposes of this disclosure, a "preset" or "presets" is a set of values that variable components within a match network are set to at the start of self-calibration and then maintained through self-calibration and mutual calibration. This consistent use of the same presets throughout multiple stages of calibration is referred to as "preset preserving" calibration. Preset preserving helps ensure calibration accuracy while providing the ability to account for errors between the first and second sensors when both sensors are measuring opposing sides of a mutual load.

The terms "Standard" and "reference sensor" are used interchangeably throughout this disclosure.

Figure 2:
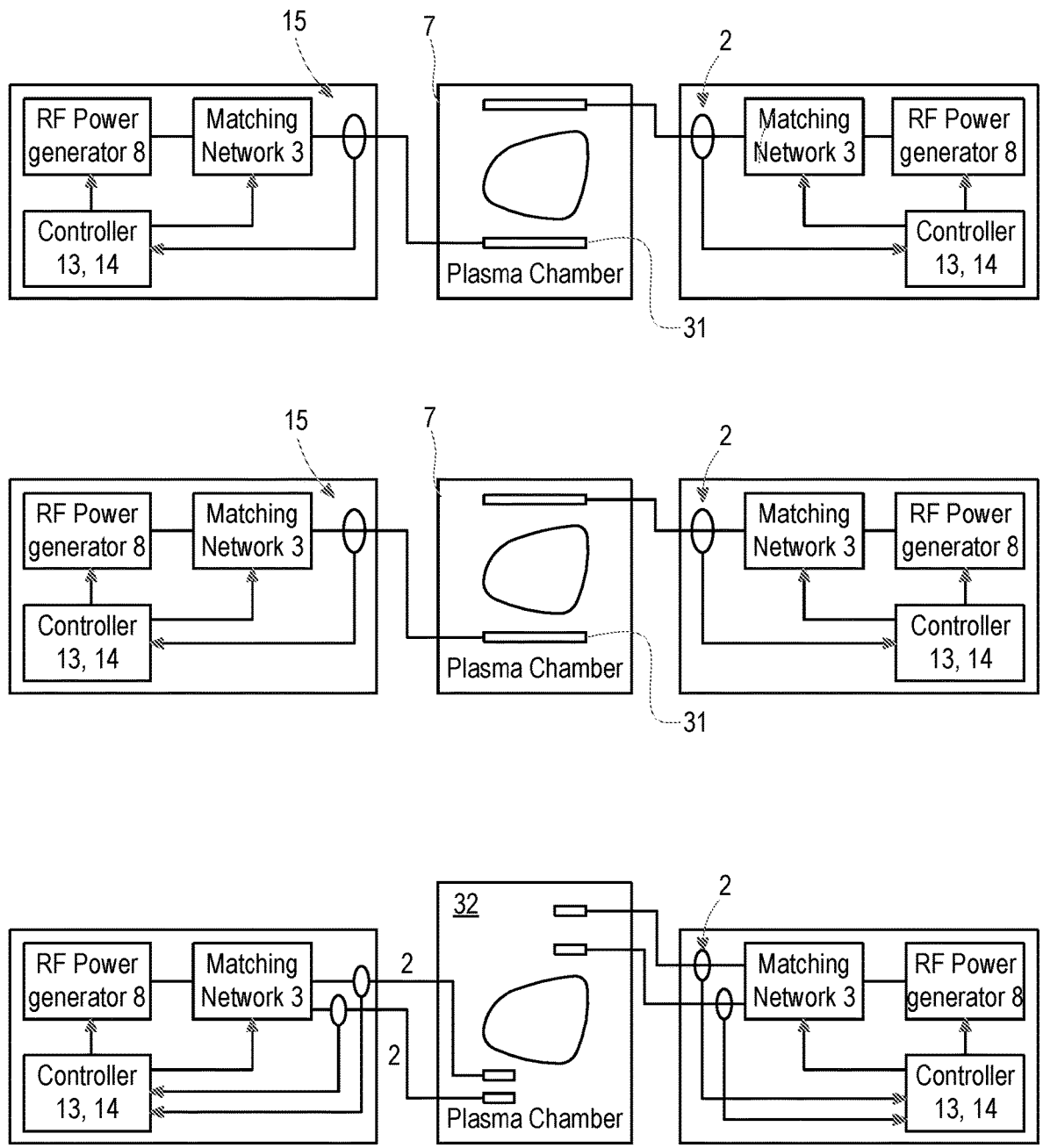
FIG. 2 illustrates further non-limiting examples of RF power generators, match networks, and plasma processing chamber.

As noted earlier, matching circuits may contain two or more sensors not all of which operate in isolation mode. Some sensors act in a cooperative mode with other sensors located within the match. For instance, in those of the examples shown in FIGS. 1-2 where a power assembly feeds two electrodes, the plasma acts as an inductive short between the two electrodes, and one sensor monitors a power delivery path while a second sensor monitors a return path to the match and then ground. Traditional calibration schemes isolate these two sensors and account for errors between those sensors and a reference when measured in isolation (i.e., without the alternative sensor in use).

The inventor has long used this type of isolated calibration, but, in search of greater accuracy, attempted a measurement with both sensors shorted across a lone inductor (later this will be a simple example of a mutual load)—a calibration setup that had the potential to better-mimic real-life operation where the same current passes through the first sensor, through a primary electrode, through the plasma, out through a secondary electrode, and then back through the match via the secondary sensor to ground. It was long thought that such a current loop would cause both sensors to see identical current in operation, and thus isolated sensor calibrations were perfectly effective. Unexpectedly, the inventor found that when the two sensors were measured while shorted across the inductor, each sensor had slightly different measurements—and this despite each sensor having already been calibrated against the same Standard. In other words, small errors appeared when the sensors were used in a situation more resembling field operation (i.e., when shorted across a plasma load). Said another way, sensors that seem to have been calibrated against the same Standard, actually show errors relative to one another when used across a mutual load or plasma load.

Given knowledge of this unusual behavior, the inventor sought to go beyond mere calibration of each sensor in isolation, and to find a calibration for the sensors when used in a dual-output situation—when shorted across a load resembling the plasma chamber that the match would see in the field—what will be referred to as a mutual load. The result was a four-step calibration as follows: (1) select a mutual load and corresponding presets for variable components of the match network; (2) self-calibration on the first sensor and self-calibration on the second sensor both against self-loads selected based on the mutual load; and (3) mutual calibration on the two sensors when used in a dual-output mode (i.e., shorted across a mutual load that mimics the plasma load that the match is being calibrated for). Mutual calibration can be performed without a reference sensor (Relative methods) or with a reference sensor (Absolute methods) arranged between the first sensor and the mutual load or between the second sensor and the mutual load.

More specifically, an end user/operator provides the match network manufacturer with a reference load, or measurements of complex impedance or measurements of voltage and currents at the chamber nodes, that a plasma processing chamber is expected to provide when coupled to the match. Calibrations can then be performed on the sensors in isolation, as before, but also in a dual-output mode when shorted across a mutual load that mimics the reference impedance provided by the end user/operator. To this end, calibration starts by creating a "mutual load" or system of components (e.g., inductors, capacitors, resistors, etc.) that has a complex impedance matching the reference load provided by the end user/operator. For instance, a simple mutual load may comprise an inductor having a value that mimics the inductance of the plasma or reference load. A set of values for the variable elements in the match network is then selected that will match, or provide maximum power delivery, when the mutual load is arranged between or shorted across the two sensors (mimicking the plasma load during calibration). These values of the variable elements can be referred to as "presets," and are maintained throughout self-calibration and mutual calibration. During mutual calibration, the mutual load is conjugately matched to the impedances associated with the fixed presets maintained in the match at both the match output and the plasma return input. Maintaining this condition permits mutual calibration to be preset preserving to maintain accuracy, while mimicking the chamber reference load data provided by the customer.

Given these presets, a so-called "self-load" can be created as a "conjugate match" to each output of the dual output match network (where the self-load includes both reactive and resistive components). In other words, the self-load is selected such that when coupled to one of the outputs of the match network, but not to the other output or the other sensor, matching will be achieved (i.e., power delivery to the self-load will be maximized). This is a nonintuitive order of operations since the mutual load is determined before the self-load, but self-calibration using the self-load set to three lab loads is performed before mutual calibration using the mutual load. Lab loads are completely reflective (reactance). A self-load may be created for both the match output and the plasma return input where a primary self-load is created for the match input and the first sensor and a secondary self-load is created for the plasma return input and second sensor. Creation or selection of the mutual load and self-loads in one embodiment is detailed in FIG. 18. The data on the self-load may also be provided by the customer/user in some cases. Customer data aside, the self-load can be considered a variable. The self-load can be thought of as a variable that takes on four values: the three lab loads used during self-calibration and the conjugate match to the match output or plasma return input, both of which are used during verification. In some cases, the self-load can be four distinct circuits of different loads, a single circuit with variable elements that can be tuned to four different loads, or a combination of these. For instance, the conjugate match can be a circuit with variable elements that can be tuned to act as a self-load for different matches, while the three lab loads can be distinct circuits that are used across a variety of equipment under test.

With the mutual load and self-load (or self-loads) in hand, and with the presets selected, calibration measurements can begin. First, the sensors can each be calibrated in isolation against a Standard (e.g., see FIGS. 8-11). These isolated calibrations, or self-calibrations, produce a first or primary calibration matrix, $K_p$, for the first sensor and a second or secondary calibration matrix, $K_s$, for the secondary sensor. These matrices can represent mappings of measurements at both sensors to the same measurements made at the Standard. In other words, the two self-calibrations for $K_p$ and $K_s$ involve mapping measurements taken of current and voltage, or complex impedance, to those same measurements taken by the Standard. Self-calibrations are performed at multiple lab loads, which are typically, a short, an open, and a high phase; but other distinct combinations may alternatively be employed.

With these self-calibration matrices, $K_p$ and $K_s$, in hand, a calibration between the two sensors, or a mutual calibration, can be performed (see FIGS. 12-17). This involves determination of a displacement matrix, D, and then multiplication of the displacement matrix, D, to one of the two self-calibration matrices to produce a modified self-calibration matrix $K_{p'}$ or $K_{s'}$. The unmodified self-calibration matrix and the modified calibration matrix (e.g., $K_p$ and $K_{s'}$), or ($K_{p'}$ and $K_s$), can be stored in the match network memory, and the match is ready to be shipped to the user with built-in calibrations for the sensors. This version of mutual calibration, without a Standard, is referred to as a Relative method, and only one modified self-calibration matrix is used once the sensors are calibrated.

More specifically, the mutual load determined earlier is arranged between the two sensors (i.e., shorting the two sensors), and the variable elements of the match network are maintained at the presets. The mutual load is matched at both sides. Reference power can be applied to the match and current and voltage measurements can be taken at both calibrated sensors (calibrated with the self-calibration matrices). Phase can be identified from the current and voltage measurements, and differences can be noted. A series of related matrices, B, N, and M can be used to determine D. The displacement matrix, D, can then be multiplied by either self-calibration matrix, to arrive at a modified self-calibration matrix, $K_{s'}$ or $K_{p'}$. The unmodified self-calibration matrix and the modified calibration matrix (e.g., $K_p$ and $K_{s'}$, or $K_s$ and $K_{p'}$) can be stored in the match network memory, and the match is ready to be shipped to the user with built-in calibrations for the sensors.

Alternatively, two displacement matrices, $D_1$ and $D_2$, can be found with the use of a Standard in the mutual calibration, and these can then be used to find both a modified first self-calibration matrix, $K_{p'}$, and a modified second self-calibration matrix, $K_{s'}$. With this Absolute version of mutual calibration, both modified self-calibration matrices are used after the sensors are calibrated.

More specifically, mutual calibration can involve arranging the Standard between either the first sensor and the mutual load or between the second sensor and the mutual load. Measurements can be made at one of the calibrated sensors and at the Standard, where the Standard is arranged on an opposing side to the given calibrated sensor. Differences between these measurements can be noted, and a series of related matrices $B_1$, $B_2$ N, $M_1$ and $M_2$ can be used to form the displacement matrices $D_1$ and $D_2$. The displacement matrices, $D_1$ and $D_2$, can then be multiplied by the respective self-calibration matrices, to arrive at modified self-calibration matrices, $K_{s'}$ and $K_{p'}$, which are stored in the match network memory. The match is then ready to be shipped to the user with built-in calibrations for the sensors.

Figure 14:
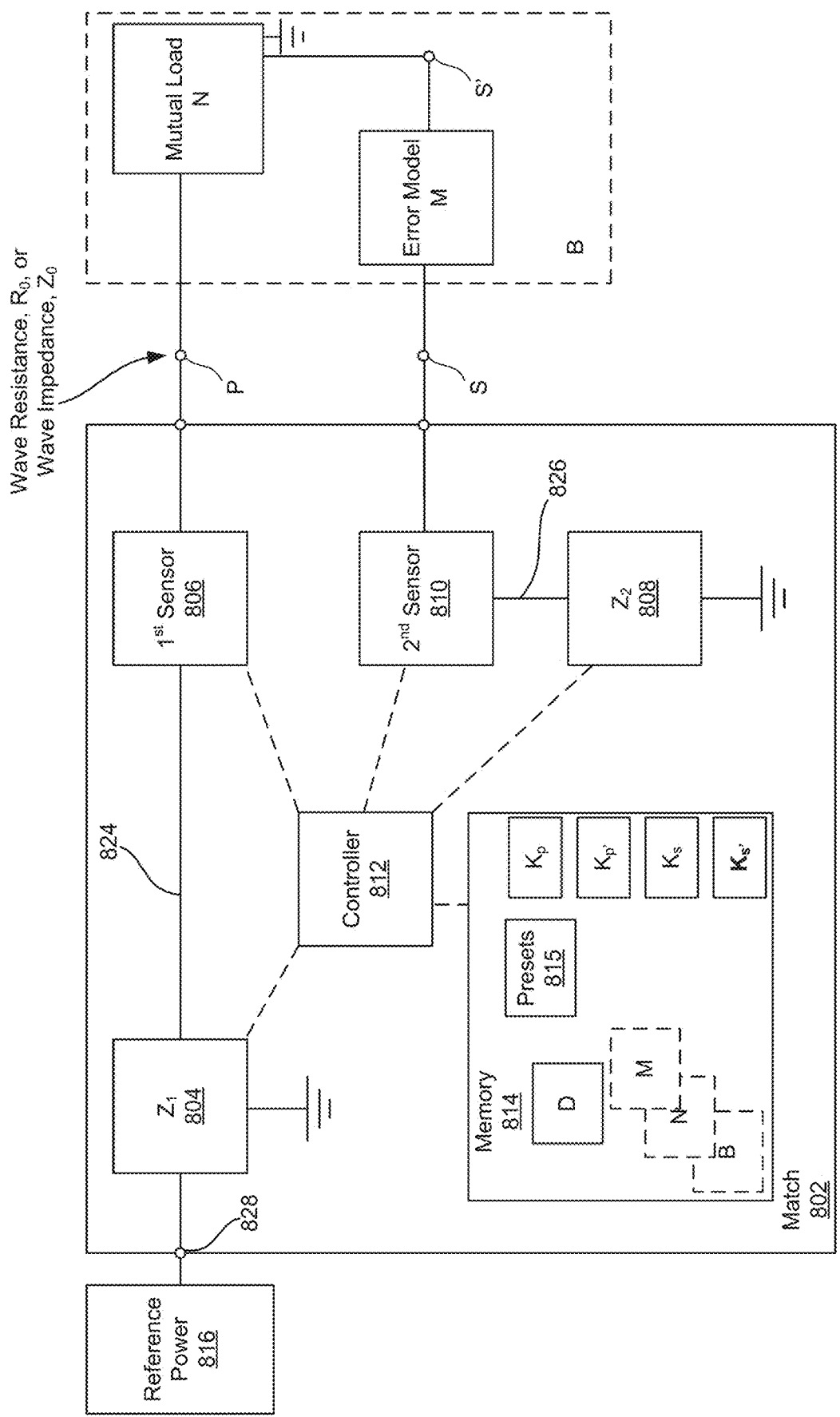
FIG. 14 illustrates a circuit diagram of a match network being calibrated via a first Relative calibration method including a mutual load represented by matrix N and an error model M.

All of the above-noted calibrations can be performed in an environment of impedance referred to as wave impedance (e.g., FIG. 14). In the prior art, the wave impedance was considered to be a real resistance, $R_0$. However, such an assumption is unnecessary and precluded calibrations of individual sensors from being carried out in the actual impedance environment at hand. The inventor recognized that greater accuracy could be achieved by enlarging the scope of calibration to include complex impedances, $Z_0$, instead of just the traditional real resistance, $R_0$. Moreover, calibration can be performed for a range of complex impedance loads rather than being unnecessarily restricted to a single load, as was performed in the prior art. The result is a calibration of the sensors that not only accounts for reactive aspects of load impedance, but also optimizes across a range of operating parameters (i.e., different loads). In particular, the calibration matrix of the Standard can be modified to the new impedance environment, so that when a complex load representing the customer focal point is affixed, consistent with the wave impedance, calibration occurs in the proper environment directly. Verification can be carried out simultaneously and improved.

Figure 3:
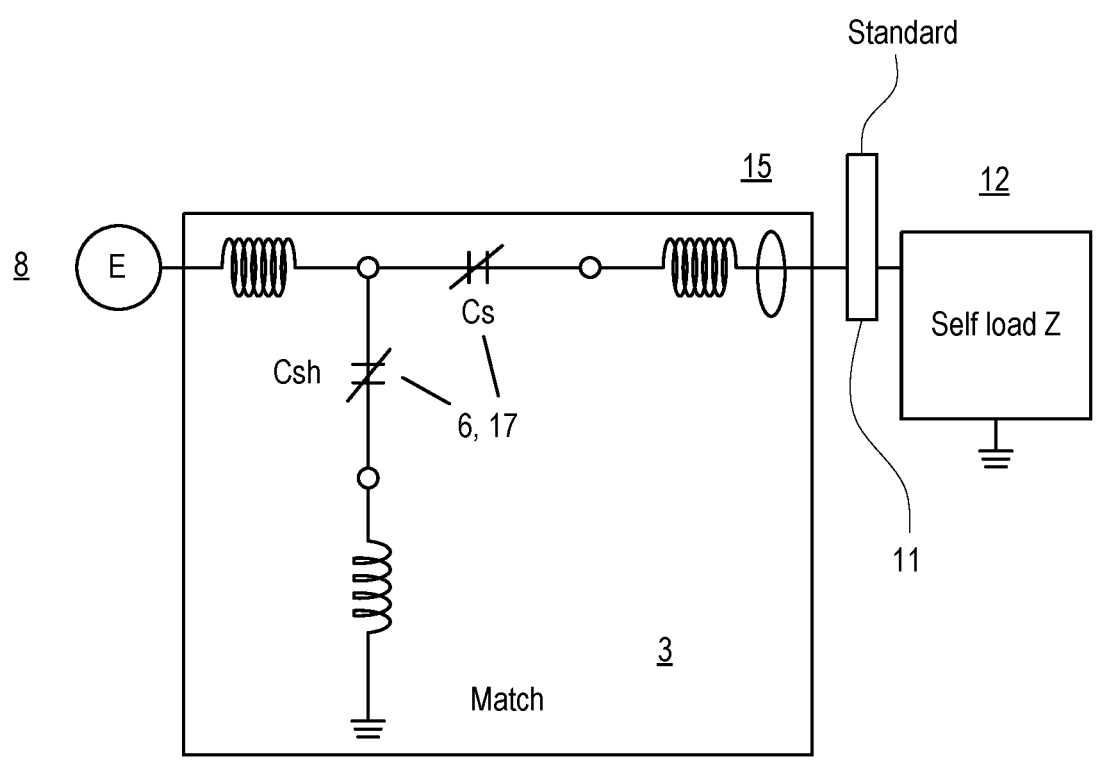
FIG. 3 illustrates an embodiment of a single-output match network being calibrated via a Standard and a self-load coupled to a first sensor.
Figure 4:
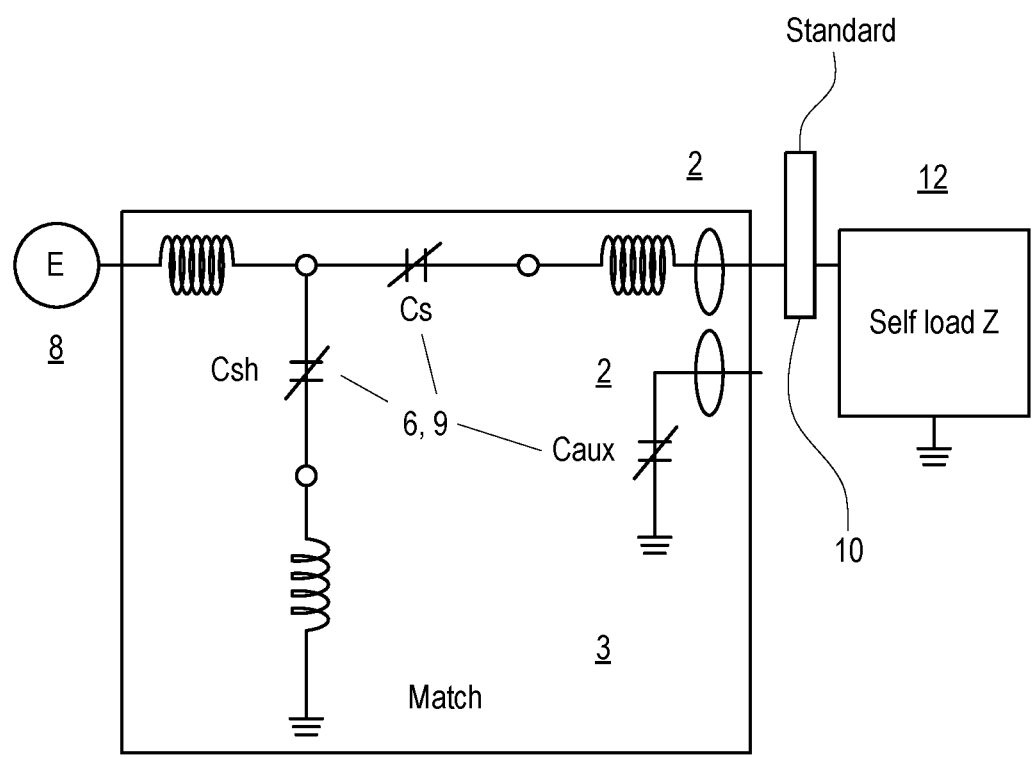
FIG. 4 illustrates an embodiment of a dual-output match network being calibrated via a Standard and a self-load coupled to a first sensor.
Figure 5:
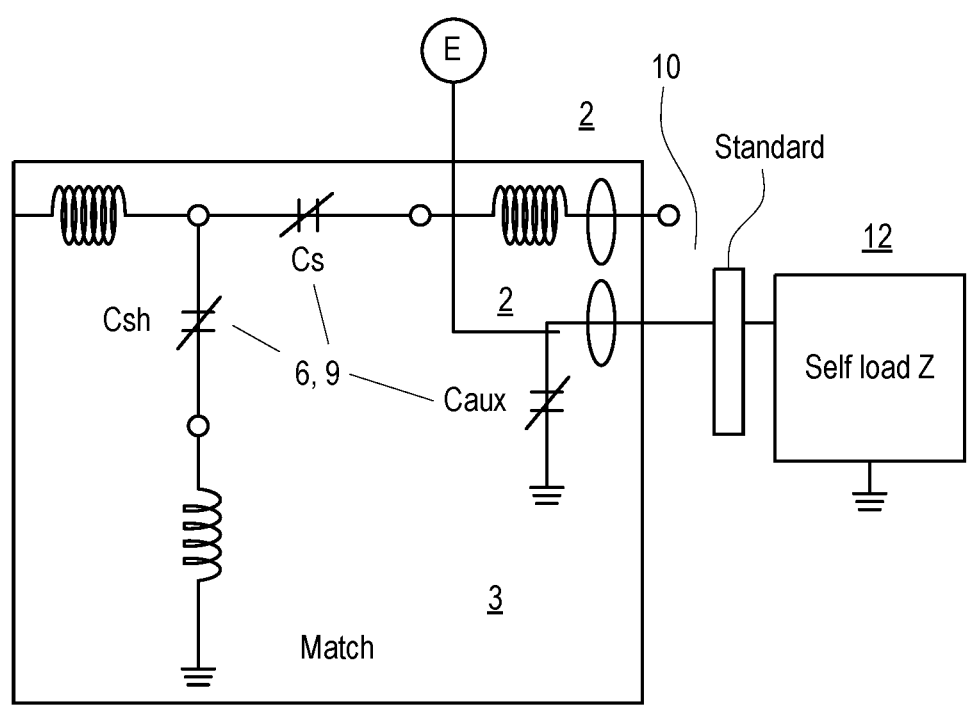
FIG. 5 illustrates the embodiment of FIG. 4 being calibrated via a Standard and a self-load coupled to a second sensor.

In many of the examples used throughout this disclosure, an EL type (e.g., FIGS. 3-5) match network is shown and described, but this disclosure is not limited to EL type match networks. The EL embodiment is ubiquitous in the industry and thus makes for a useful illustration. However, those of skill in the art will easily apply this disclosure to non-EL match topologies.

The following descriptions will concurrently reference the systems seen in FIGS. 8-17 and the methods seen in FIGS. 18-23. The structure of this discussion will follow the general order of operation for calibrating match network sensors: (1) determine mutual load, self-load, and presets; (2) self-calibrations of each sensor in isolation; and (3) mutual calibration based on the self-calibrated sensors used in tandem. Further details of the (4) systems, (5) methods, and alternative topological applications will then be given.

I. Mutual Load, Self-Load, and Match Network Presets

The match networks seen throughout this disclosure, such as but not limited to 802 and the match networks of FIGS. 12A-12E, are often manufactured for use in a plasma processing system where the generator and/or plasma processing chamber may or may not be manufactured by a different entity. Thus, the chamber may not be available for calibration.

Figure 8:
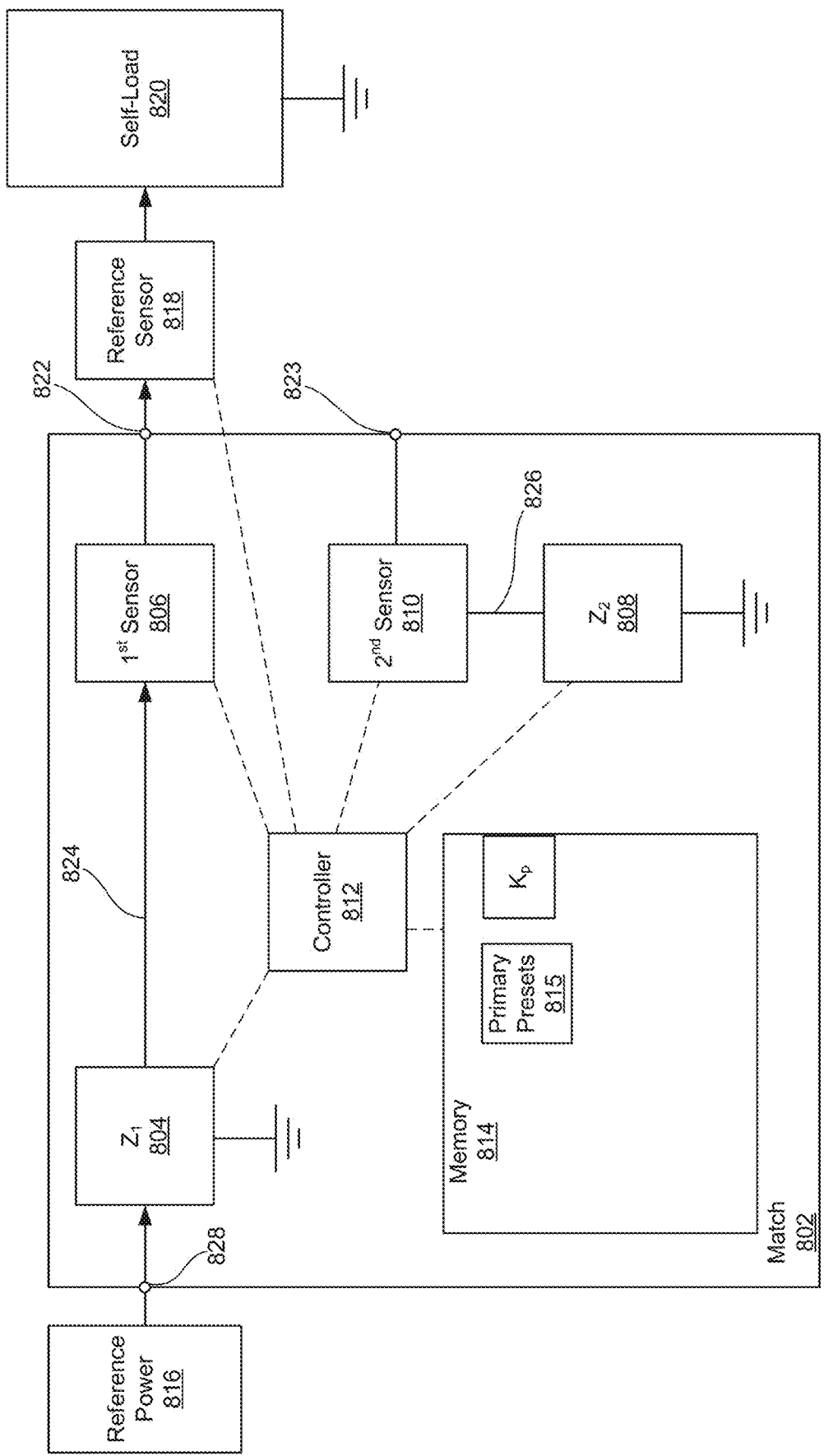
FIG. 8 illustrates an embodiment of a system for self-calibration of a first sensor of a dual-output match network via a self-load.
Figure 10:
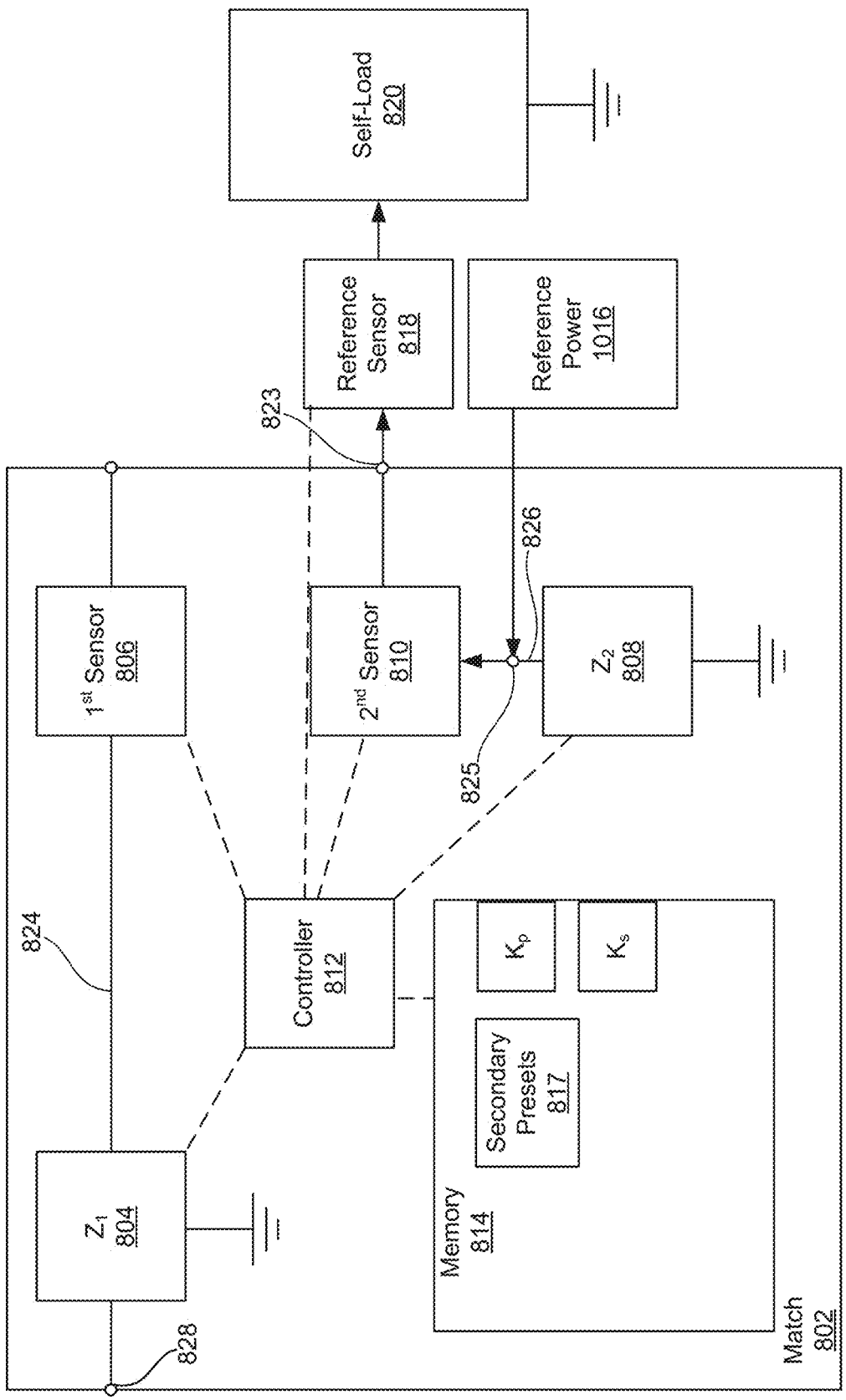
FIG. 10 illustrates an embodiment of a system for self-calibration of a second sensor of a dual-output match network via a self-load.
Figure 13:
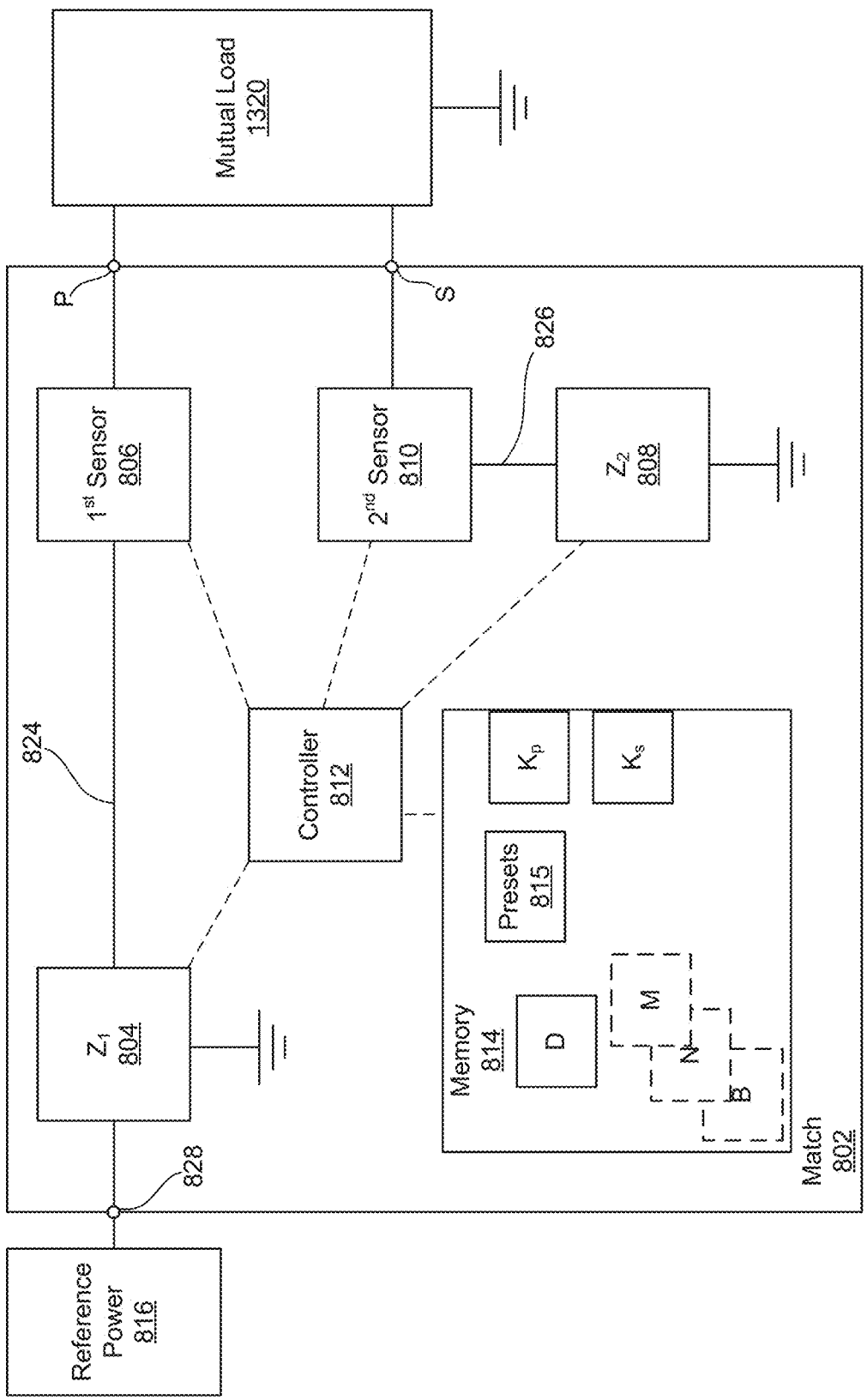
FIG. 13 illustrates a circuit diagram of a match network being calibrated using a mutual load coupled between a match output and a plasma return input.

Instead, a mutual load and self-load(s) are fabricated to mimic the complex impedance of the actual chamber to which the match network 802 will be coupled to in the field. However, each chamber and even each plasma recipe for a given chamber, may have a different complex impedance, and thus a different reference load may be assigned to each chamber and to each recipe for a given chamber (Block 1802 in FIG. 18). The reference load can take the form of a circuit or voltage and current data (including phase) collected from the chamber. The reference load can be a self- or a mutual load. The reference load can be received either topologically, theoretically, or by data. Calibrations can then be performed for different chambers and different recipes within a given chamber. The mutual load and self-load are circuits comprising reactive and resistive components and used during calibration to mimic the reference load and self-load(s) provided by the end user. The mutual load and self-load are created before calibration measurements are taken in order to replicate the reference load during calibration measurements (Blocks 1804 and 1808 of FIG. 18). FIG. 13 shows an example system where a mutual load 1320 is arranged between the two sensors 806, 810. The self-load is created to mimic the reference load when one of the outputs of the match network 802 is coupled to the self-load. FIGS. 8 and 10 show examples of the system where a self-load 820 is coupled between one of the sensors 806, 810 and ground.

The mutual load 1320 and self-load 820 can be formed from various combinations of impedance, capacitive, and resistive devices arranged in series or in parallel (i.e., a combination of reactive and resistive components). Those of skill in the art can easily create or fabricate a mutual load 1320 and self-load 820 accurately mimicking the effects of the reference load, and thus specifics of these calibration loads, or how to devise them, are not needed in this disclosure. Self-calibration is typically performed separately for the first sensor 806 and the second sensor 810, so, the self-load for the primary and the secondary calibrations are generally different impedances (e.g., a primary self-load and a secondary self-load).

With the mutual load 1320 created, the match network 802 can be tuned or set to match or act as a conjugate match to the mutual load 1320. In other words, variable elements in the match 802 (e.g., 804 and 808 in FIG. 8) can be set to values that achieve impedance matching with the mutual load 1320, or provide maximum power delivery to the mutual load during, calibration (and similarly to the plasma processing chamber when the calibrated match is deployed). These values of the variable elements can be referred to as "presets" or a "preset" (and are used in Blocks 1806 and 1810). More specifically, the values of the first variable elements 804 can be primary presets and the values of the second variable elements 808 can be secondary presets. At the start of each phase of calibration, the variable elements will be set to the presets (or held at the presets), and thus the calibration can be referred to as preset-preserving.

An EL-type match network 802 is illustrated throughout this disclosure (i.e., FIG. 3-5), but this is not intended to be limiting. The systems and methods disclosed herein can easily be applied to other match topologies without undue experimentation by those of skill in the art.

Given these presets, a so-called "self-load" can be created as a "conjugate match" to each output of the dual output match network 802 with the presets applied (Block 1808). In other words, like the mutual load 1320, the self-load 820 is selected such that when coupled to one of the outputs of the match network 802, matching will be achieved (i.e., power delivery to the self-load 820 will be maximized). Naturally, self-loads for different outputs differ in general. However, whereas the mutual load is created based on the reference load in addition to taking secondary match network presets into account, the self-load(s) is created on a node-by-node basis based on the presets at that node (the node being the output or the plasma return input).

II. Self-Calibration

Those of skill in the art will be aware of various methods for performing self-calibration and any of these can be used to prepare the self-calibration matrices, $K_p$ and $K_s$, that will be used in the novel mutual calibration methods described later. However, the following provides one example of a method for self-calibration. Self-calibration seeks to find and map errors between each sensor and a Standard when that sensor is calibrated in isolation (i.e., without the second sensor being coupled to the active circuit or current path). FIGS. 8-11 show systems used in self-calibration. But, before digging into specifics of self-calibration, it is helpful to first look at equations that will be used in this mapping.

Calibration can be thought of as a mapping of one set of three complex numbers onto a second set with the use of a bilinear mapping as shown in Equation 1 below.

$$f(z) = \frac{az+b}{cz+d} \quad \text{(Equation 1)}$$

This mapping can also be perceived in matrix form, where the self-calibration matrix, K (see Equation 2 below), is a mapping of measurements for the Standard against measurements by the sensor to be calibrated. In other words, the self-calibration matrix, K, is a collection of the constants from the bilinear transformation of Equation 1 in matrix form as shown in Equation 2 below:

$$K = \begin{bmatrix} a & b \\ c & d \end{bmatrix} \quad \text{(Equation 2)}$$

Figure 7:
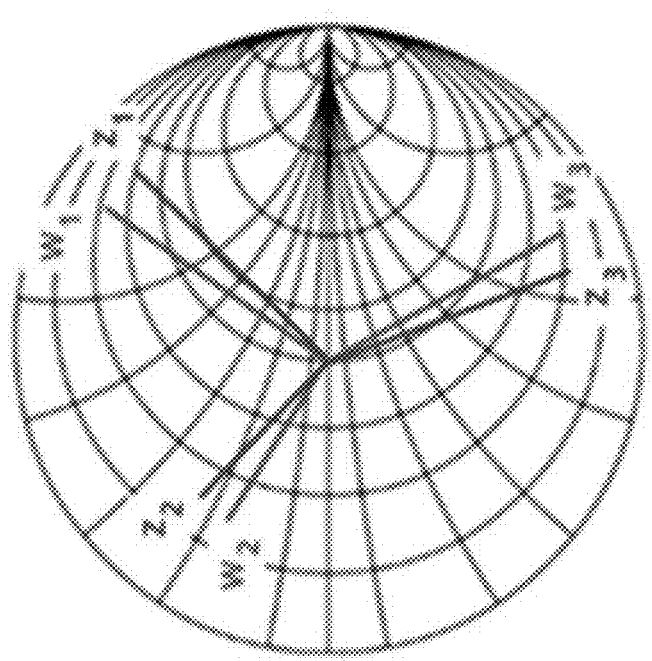
FIG. 7 illustrates an example of a Smith Chart showing errors between a sensor to be calibrated and a Standard for the open, short, and hi-phase states of a self-load.

Each coefficient, a, b, c, and d, represents a type of motion in the complex plane or Smith chart as it were (see, e.g., FIG. 7). The "a" constant represents scaling and/or rotation. Measuring "a" during calibration indicates whether a reflection coefficient measured at the Standard encounters a phase shift for example or attenuation or both. The constant "b" represents translation independent of inversion. This can represent a systematic error between the sensor and the Standard. If the sensor has this kind of systematic error and were uncalibrated, the center of the Smith Chart as measured by the sensor would be shifted with respect to the Standard as would the match point at the center of the Smith Chart. The "c" constant represents inversion. The "d" constant represents translation preceding inversion. While the prior art makes assumptions about these constants and simplifies them for calibration, this disclosure moves forward without any assumptions or simplifications of the definitions of these constants, and instead considers these constants in their full, non-simplified, forms:

$$a=(w_3)(w_1-w_2)(z_2-z_3)-(w_1)(w_2-w_3)(z_1-z_2) \quad \text{(Equation 3)}$$

$$b=(w_1z_3)(w_2-w_3)(z_1-z_2)-(w_3z_1)(w_1-w_2)(z_2-z_3)-(w_3z_1)(w_1-w_2)(z_2-z_3) \quad \text{(Equation 4)}$$

$$c=(w_1-w_2)(z_2-z_3)-(w_2-w_3)(z_1-z_2) \quad \text{(Equation 5)}$$

$$d=(z_3)(z_1-z_2)(w_2-w_3)-(z_1)(z_2-z_3)(w_1-w_2) \quad \text{(Equation 6)}$$

Where $w_i$ is a set of complex numbers representing reflection coefficients as determined from impedance data, or voltage, current and phase data for the Standard, while $z_i$ is a set of complex numbers representing reflection coefficients as determined from impedance data, or voltage, current and phase data for the sensor to be calibrated. Said another way, self-calibration is characterized as a mapping of one set of three complex numbers (reflection coefficients as determined from impedance data or, equivalently, voltage, current, and phase data) measured from a signal wave, measured at a sensor to be calibrated, to three complex numbers measured from the same signal at the Standard with the use of a bilinear mapping. To arrive at the calibration matrix, K, one measures values for $w_i$ and $z_i$ at three different lab loads, and substitutes these into Equations 3-6. These populated equations can then be substituted into Equation 2 to give a self-calibration matrix, K, for the sensor being calibrated. More specifically, $K_p$ is the self-calibration matrix for a first sensor (e.g., 806), or a primary self-calibration matrix, and $K_s$ is the self-calibration matrix for a second sensor (e.g., 810), or a secondary self-calibration matrix. In this way, the calibration matrix, K, is a function of the reflection coefficients, $w_i$ and $z_i$, measured at the Standard and the sensor to be calibrated, respectively.

For instance, FIG. 7 illustrates a Smith chart showing six complex impedances, or complex measured parameters such as reflection coefficients or impedance. The measurements at the Standard are represented by $w_1$, $w_2$, and $w_3$, while the measurements at the sensor to be calibrated are represented by $z_1$, $z_2$, and $z_3$. The calibration matrix, K, includes a mapping of $w_1$ to $z_1$, $w_2$ to $z_2$, and $w_3$ to $z_3$.

Figure 9:
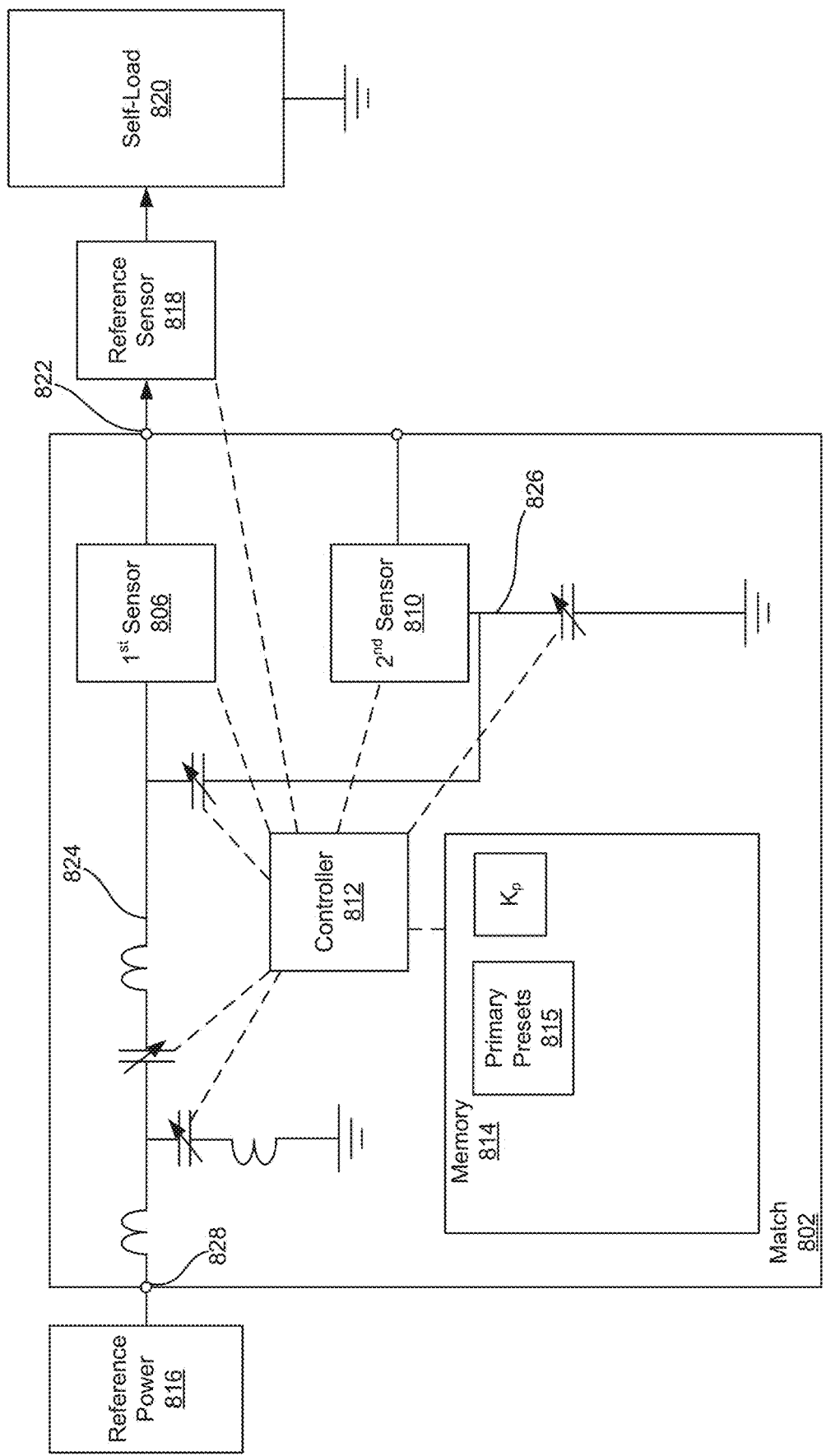
FIG. 9 illustrates another embodiment of a system for self-calibration of a first sensor of a dual-output match network via a self-load.
Figure 11:
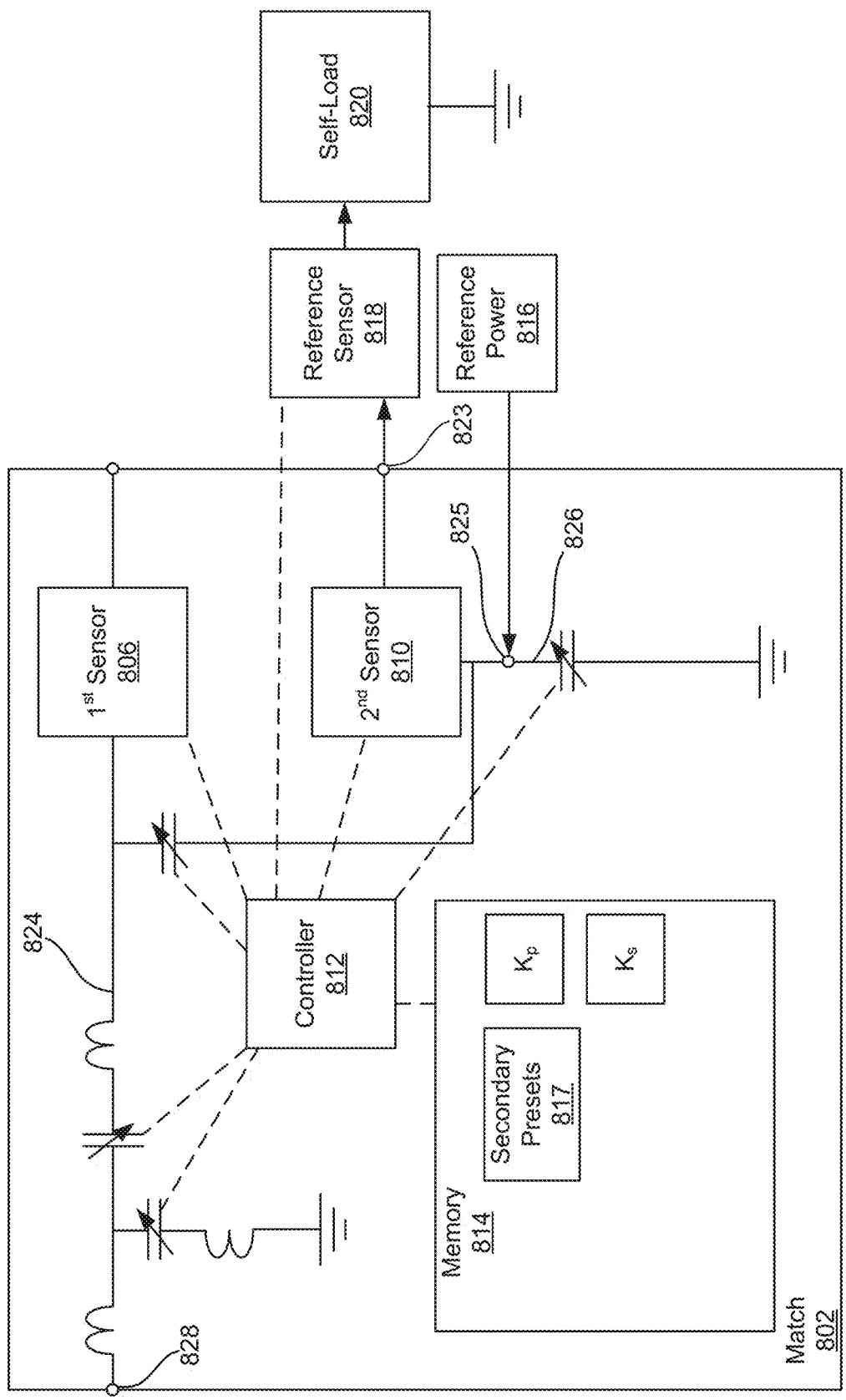
FIG. 11 illustrates another embodiment of a system for self-calibration of a second sensor of a dual-output match network via a self-load.

FIGS. 8-11 illustrate embodiments of a system used to determine the calibration matrix, K. Specially, FIGS. 8 and 9 show use of a self-load 820 that can be adjusted to present a first set of three lab loads to the match network 802 to determine the self-calibration matrix, $K_p$, for a first sensor 806, and FIGS. 10 and 11 show use of the self-load that can be adjusted to present a second set of three lab loads to the match network 802 (maintained at the presets) to determine the self-calibration matrix, $K_s$, for a second sensor 810. A single self-load 820 can be used for both calibrations and merely adjusted between the loads of the first and second set of lab loads. Alternatively, two different self-loads can be used, each able to adjust between three lab loads configured for a different one of the two sensors 806, 810.

Figure 18:
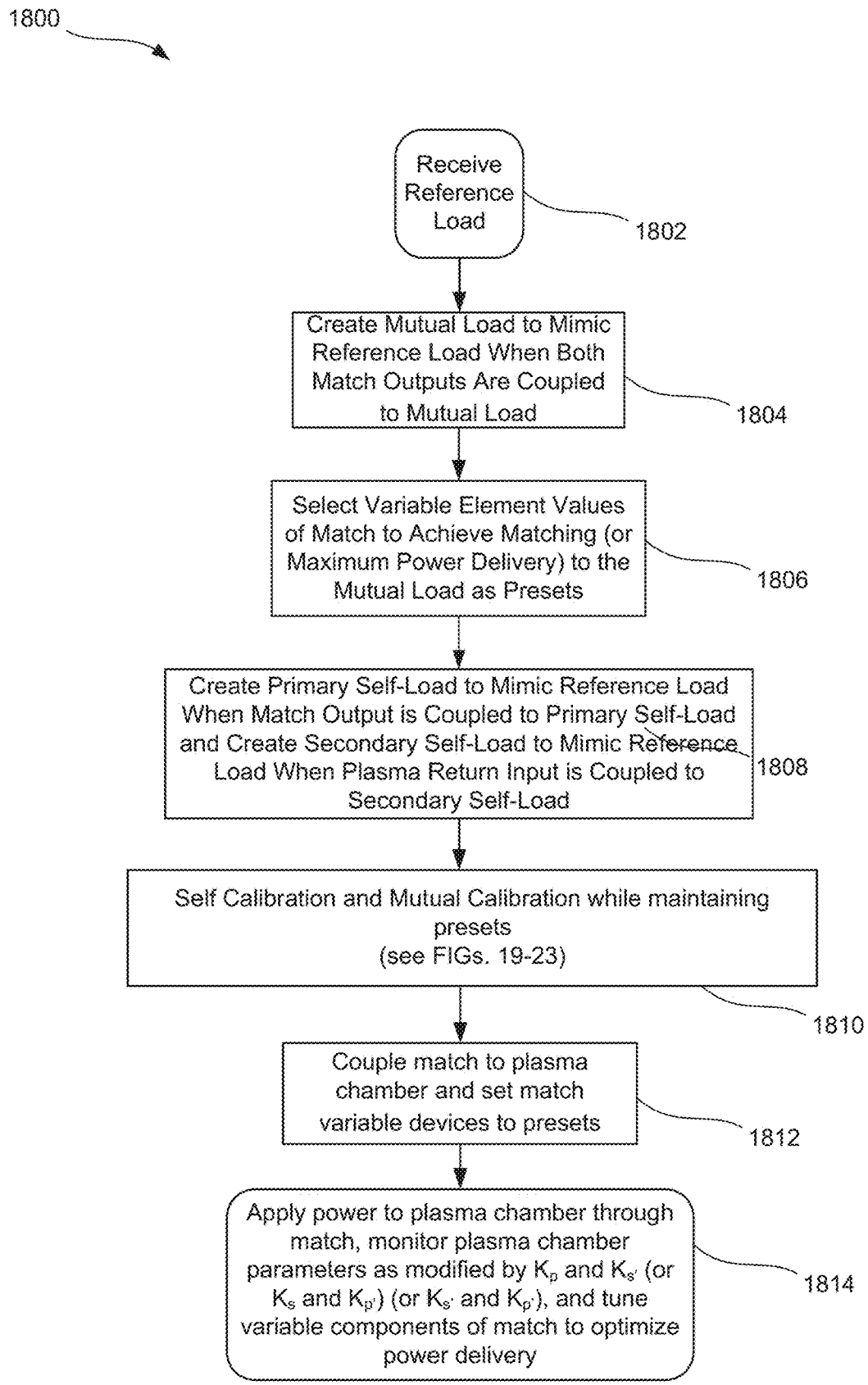
FIG. 18 illustrates a method of calibrating sensors of a dual-output match network and using the calibrated sensors during plasma processing.
Figure 19:
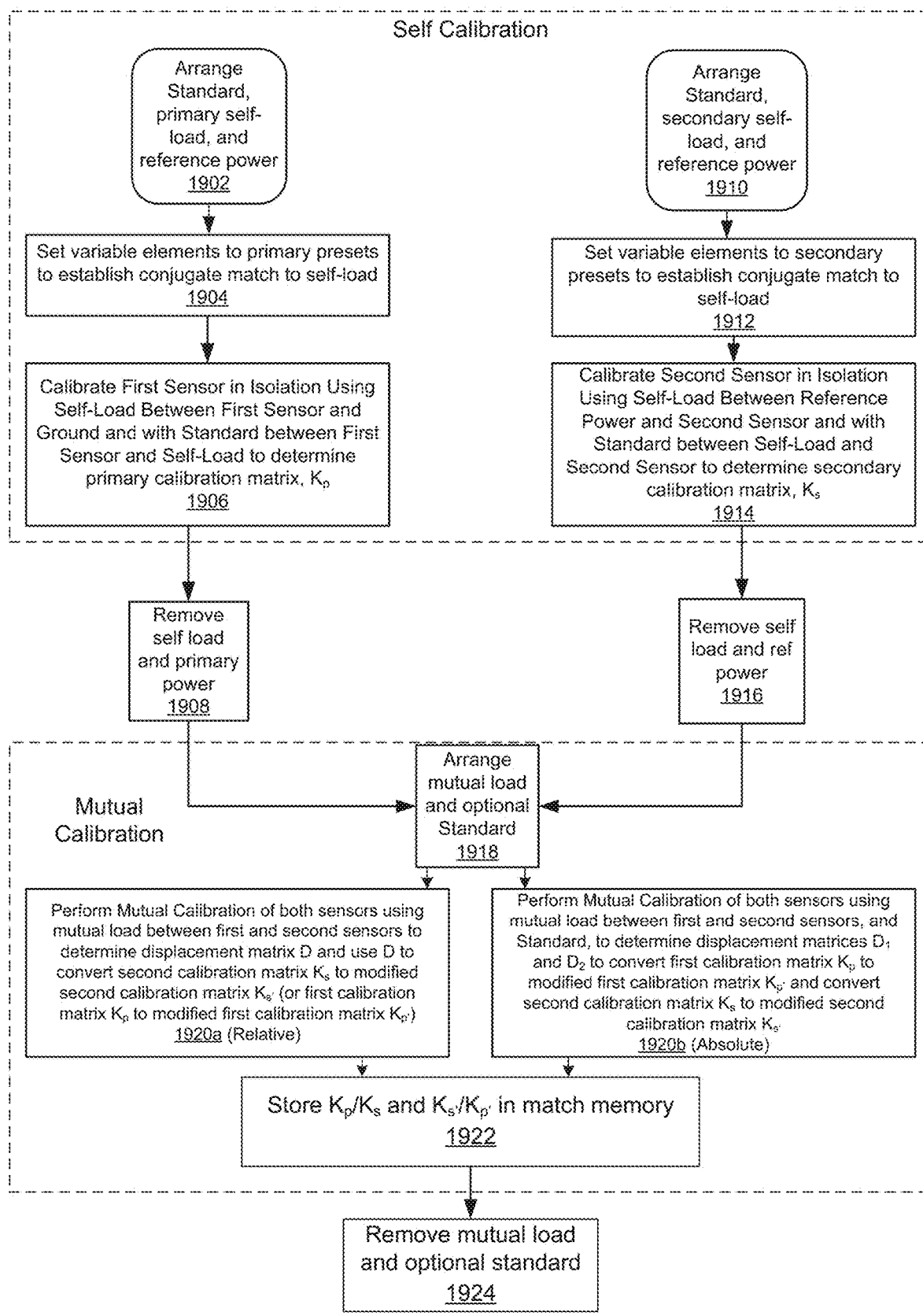
FIG. 19 illustrates a method of self-calibration and mutual calibration.
Figure 20:
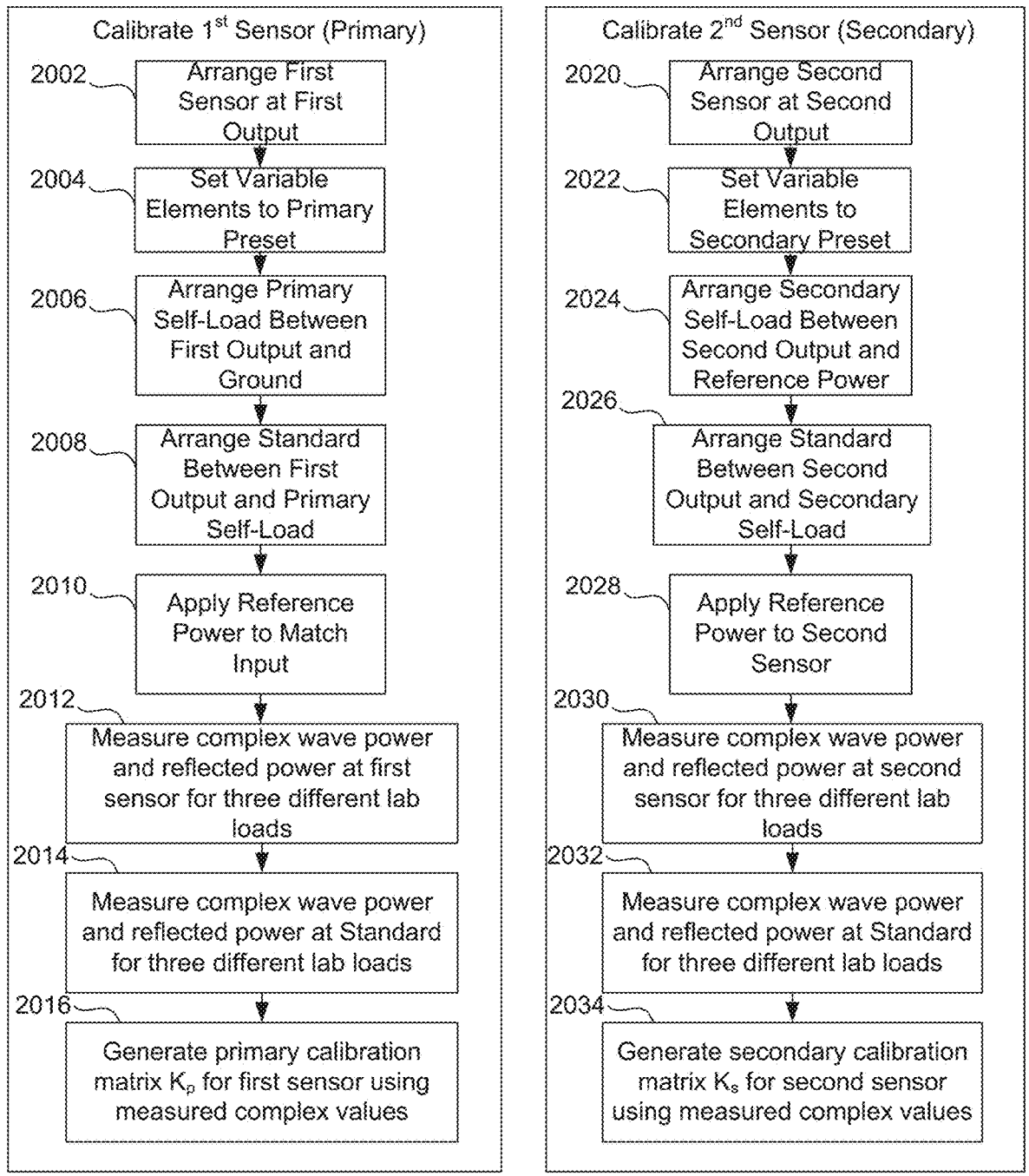
FIG. 20 illustrates further details of self-calibration.
Figure 21:
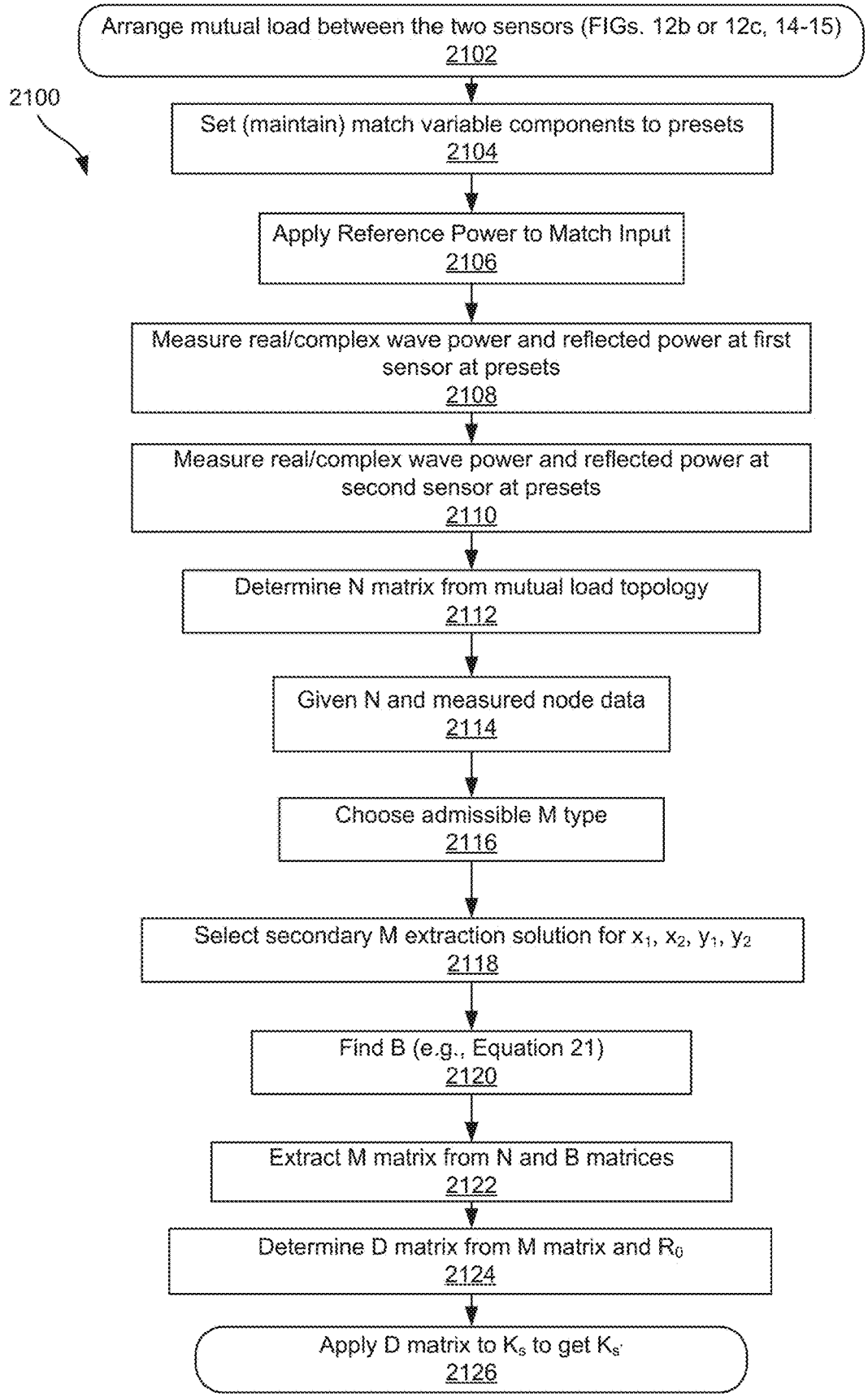
FIG. 21 illustrates further details mutual calibration in the form of a first Relative mutual calibration method.
Figure 22:
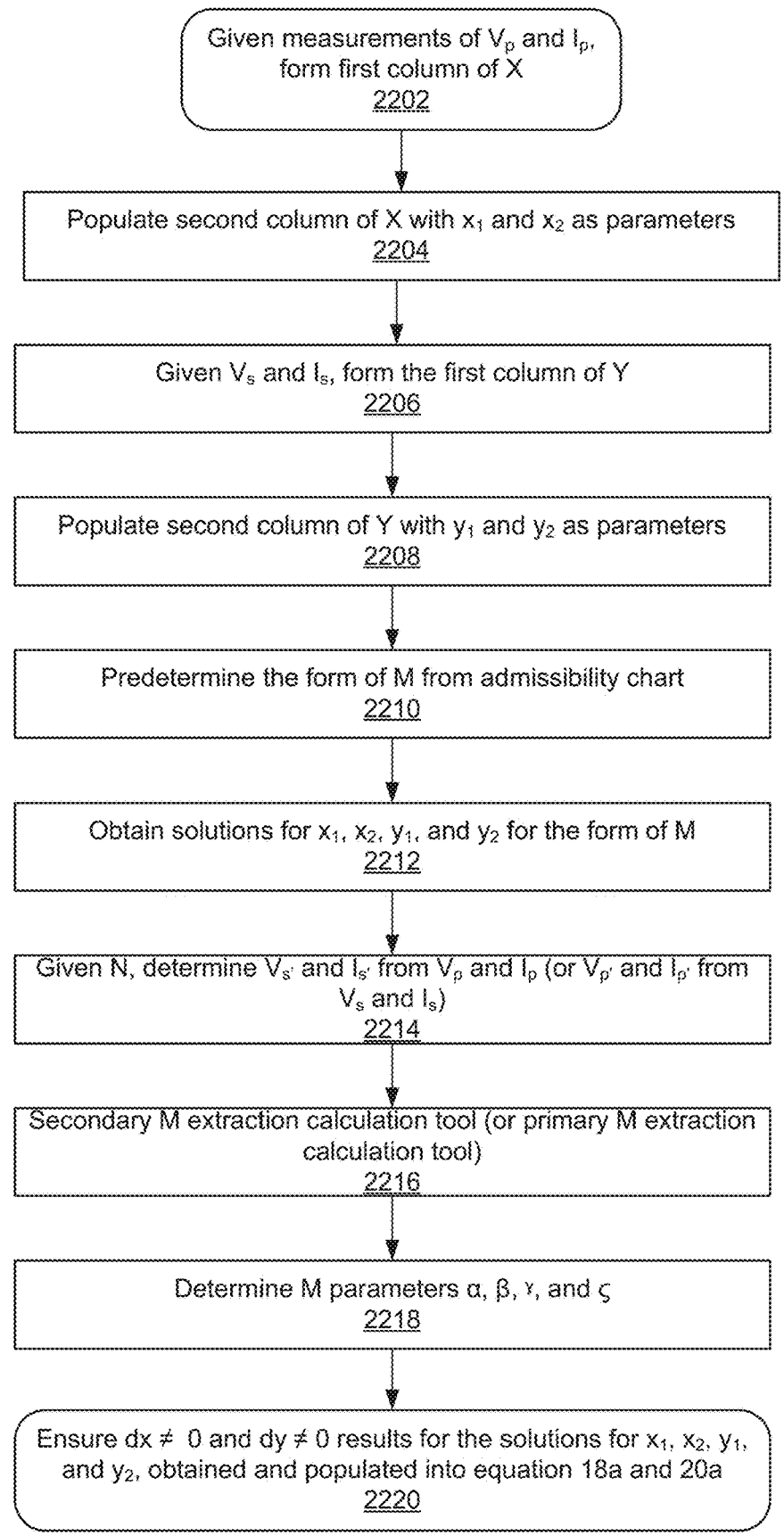
FIG. 22 illustrates further details of determining the x and y vectors as part of the method 2100.
Figure 23:
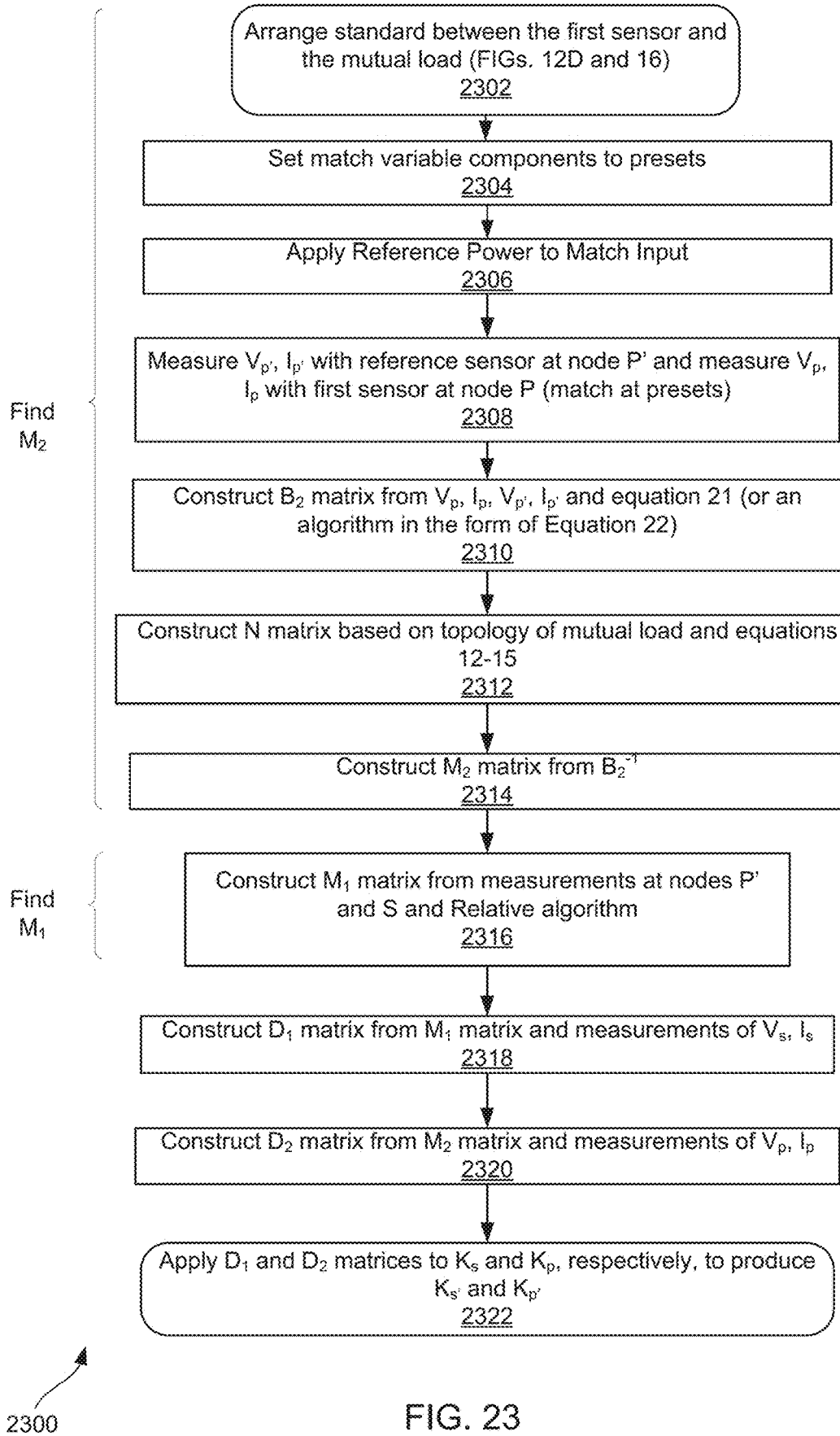
FIG. 23 illustrates further details of mutual calibration in the form of a first Absolute mutual calibration method.

FIGS. 18 and 19 provides an overview of calibration including a self-calibration phase and a mutual calibration phase. FIG. 20 provides an embodiment of details of the self-calibration, while FIGS. 21-23 provide details of the mutual calibration. These method figures will be referenced during the following discussion of the systems shown in FIGS. 8-11.

Figure 6:
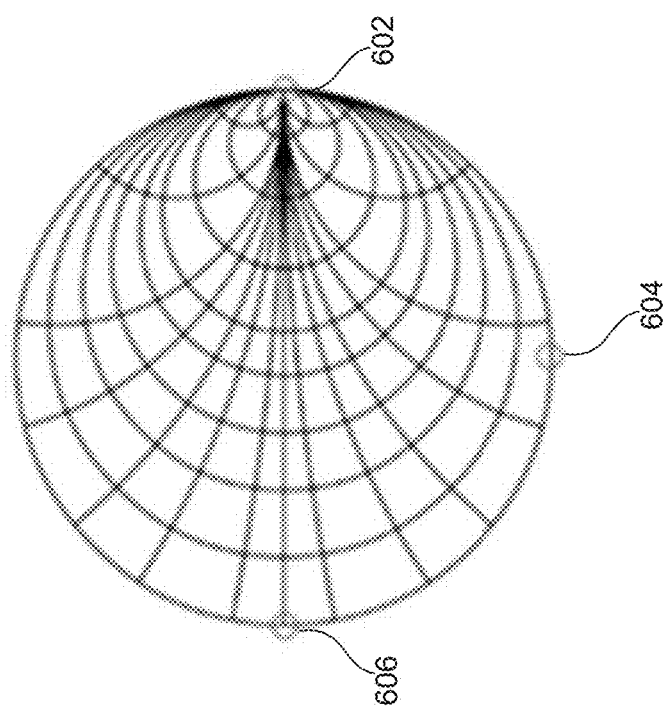
FIG. 6 illustrates an example of a Smith Chart showing the open, short, and hi-phase states of the self-load.

In FIGS. 8 and 9 the self-load 820 can be coupled between an output 822 of the match network 802 and ground (Block 1902 in FIG. 19 and Block 2006 in FIG. 20), and the Standard 818 can be arranged between, or take measurements between, the output 822 and the self-load 820 (Blocks 1902 and 2008). A reference power source 816 can be coupled to a match input 828 of the match network 802 (Block 1902). A controller 812 can read the primary presets 815 from a memory 814 of the match network 802 and instruct the variable elements 804 to set to the primary preset values (Blocks 1904 and Block 2004) (if they are not already set to the primary presets) to establish a conjugate match to the self-load 820. The reference power source 816 can be turned on (Block 2010), and measurements of current and voltage (and phase from these) can be taken at the first sensor 806 and the Standard 818 (Blocks 1906 and 2012/2014) at three different lab loads, while the variable components 804 of the match network 802 are held fixed at the primary presets. Lab loads are three loads used as references, and in this embodiment are the open, short, and "hi phase" as shown on the Smith Chart in FIG. 6. However, this set of three lab loads is not limiting, and any other combination of three distinct lab loads could also be used. These measurements can give a complex impedance, $w_1$, $w_2$, $w_3$, $z_1$, $z_2$, and $z_3$, at each of the three lab loads, which can then be plugged into Equations 3-6 and then populated values for a, b, c, and d can be inserted into the matrix in Equation 2 to provide the first or primary calibration matrix, $K_p$ (Blocks 1906 and 2016). A verification step can be performed after the primary calibration matrix, $K_p$, is determined, to scale the matrix to account for power amplitude errors. This scaling calibration, or verification, is well-known to those of skill in the art and is therefore not shown in the figures.

The self-load 820 can be removed from the primary output 822 (Block 1908), and coupled between the plasma return input 823 and ground (see FIGS. 10 and 11) (Blocks 1910 and 2024), and set to a second set of lab loads than was used during calibration of the primary sensor 806 (or a different or second self-load can be used). In other words, the self-load 820 in FIGS. 8 and 9 differs from that in FIGS. 10 and 11 or is at least operated at a different set of lab loads. The standard 818 can be arranged between, or take measurements between, the plasma return input 823 and the self-load 820 (Blocks 1910 and 2026). The primary power source can be removed (Block 1908) and a reference power source 816 can be coupled to a node 825 between variable elements 808 in the match network 802, and the secondary sensor 810 (Block 1910). The controller 812 can read the secondary presets 817 from the memory 814 of the match network 802 and instruct the variable elements 808 to move to the secondary preset values (Blocks 1912 and 2022) to establish a conjugate match to the self-load 820. It should be noted that the self-load 820 in FIGS. 8 and 9 may be different than the self-load 820 in FIGS. 10 and 11, or may be the same self-load, but with tweaked internal component values. For this reason, the self-load used to calibrate the first sensor may be referred to as a first self-load and the self-load used to calibrate the second sensor may be referred to as a second self-load. The reference power source 816 can then be turned on (Block 2028), and measurements of current and voltage can be taken at the secondary sensor 810 (Block 2030) and the Standard 818 (Block 2032) at three different lab loads (which may or may not be the same lab loads used for calibrating the primary sensor 806), while the variable components 808 of the match network 802 are held fixed at the secondary presets 817. Phase can be identified from the current and voltage measurements. These measurements can give a complex impedance, $w_1$, $w_2$, $w_3$, $z_1$, $z_2$, and $z_3$, which can be plugged into Equations 3-6 and then populated values for a, b, c, and d can be inserted into the matrix in Equation 2 to provide the second or secondary calibration matrix, $K_s$ (Blocks 1914 and 2034). A verification step can be performed after the secondary calibration matrix, $K_s$, is determined, to scale the matrix to account for power amplitude errors. This scaling calibration, or verification, is well-known to those of skill in the art and is therefore not shown in the figures.

Although calibration of the first sensor was described before self-calibration of the second sensor, this order of operation is not necessary. This completes self-calibration, and leaves the self-calibration matrices, $K_p$ and $K_s$, stored in the match network's memory 802. The method 1900 can proceed to perform mutual calibration and determine a displacement matrix, D, or displacement matrices, $D_1$ and $D_2$, as detailed in FIGS. 21-23.

FIG. 20 illustrates details of the self-calibrations discussed relative to FIG. 19. Self-calibration of the primary and secondary sensors is similar and the order of self-calibrating these two sensors is not important. Hence, the two chains of operations in this figure are shown in parallel. For the sake of simplicity, self-calibration of the first sensor is discussed first, followed by the second sensor. The first sensor can be arranged at the output of the match network (Block 2002). In practice, the first sensor may be arranged inside the match network and as close to the output 822 as possible as long as it is arranged between the last match network component on a first conductive path and the plasma processing chamber, and preferably as close to the output as possible. The primary variable elements in the match network can be set to the primary preset (Block 2004). The primary self-load can be coupled to the first sensor between it and ground, such that the output of the match network is directed through the self-load to ground (Block 2006). The Standard can be arranged between the first sensor and the self-load, or arranged to measure a node between the first sensor and the primary self-load (Block 2008). Reference power can be applied to the match network at the match input (Block 2010) as shown, for example in FIG. 8. The first sensor can measure complex wave power and reflected power for three different lab loads while the primary variable elements 804 of the match network remain fixed at the primary presets (Block 2012). These three lab loads are referred to as open, short, and "hi phase" in an embodiment and are shown on the Smith Chart in FIG. 6. However, this set of three lab loads is not limiting, and any other combination of three distinct loads could also be used. These three lab loads are implemented by adjusting the self-load 820 to the three lab loads (e.g., open, short, and hi-phase). In some embodiments, this can include tuning a variable self-load to these three lab loads, while in other embodiments, it can include coupling three distinct circuits to the match network, those three circuits having distinct loads. The Standard can also measure the complex wave power and reflected power for these same three lab loads (Block 2014). The first sensor measurements and the Standard measurements are taken at the same time. These two sets of measurements provide values for the complex impedance coefficients (or reflection coefficients) $w_1$, $w_2$, and $w_3$ and $z_1$, $z_2$, and $z_3$, that can be substituted into Equations 3-6 and used to generate a primary calibration matrix, $K_p$, for the first sensor (Block 2016).

A similar set of steps can be carried out for the secondary sensor. The secondary sensor can be arranged at a plasma return input of the match network (Block 2020). In practice, the secondary sensor may be arranged inside the match network as long as it is arranged as close to the output 823 as possible and between the last match network component on a second conductive path and the plasma processing chamber, and preferably as close to the output as possible. The variable elements in the match network can be set to the secondary preset (Block 2022). The secondary self-load can be coupled to the secondary sensor between it and ground, such that the plasma return input of the match network is directed through the self-load to ground (Block 2024). The Standard can be arranged between the secondary sensor and the self-load, or arranged to measure a node between the secondary sensor and the secondary self-load (Block 2026). Reference power 816 or 1016 can be applied through the second conductive path of the match network (Block 2028) as shown, for example in FIG. 9 or FIG. 10. The secondary sensor can measure complex wave power and reflected power for three different lab loads while the secondary variable elements 808 remain fixed at the secondary presets (Block 2030). These three lab loads can be referred to as open, short, and "hi phase" in an embodiment and are shown on the Smith Chart in FIG. 6. However, this set of three lab loads is not limiting, and any other combination of three distinct loads could also be used. These three lab loads are implemented by adjusting the self-load 820 to the three lab loads (e.g., open, short, and hi-phase). The Standard can also measure the complex wave power and reflected power for these same three lab loads (Block 2032). The secondary sensor measurements and the Standard measurements are taken at the same time. These two sets of measurements provide values for the complex impedance coefficients (or reflection coefficients) $w_1$, $w_2$, and $w_3$ and $z_1$, $z_2$, and $z_3$, that can then be substituted into Equations 3-6 and used to generate a secondary calibration matrix, $K_s$, for the secondary sensor (Block 2034).

Again, with the self-calibration matrices, $K_p$ and $K_s$, stored in the match memory, one can now proceed to mutual calibration.

III. Mutual Calibration

Mutual calibration can be performed in a Relative or Absolute manner, where the Relative couples a mutual load across the first and second sensor (e.g., FIGS. 12B and 12C), and where the Absolute couples a mutual load across the first and second sensor, but also includes a reference sensor (the Standard) between the mutual load and one of the two sensors (e.g., FIGS. 12D and 12E). FIGS. 14-15 and 21-22 relate to the Relative method while FIGS. 16-17 and 23-24 relate to the Absolute method.

A. Relative Method

Whereas the self-calibration matrices, $K_p$ and $K_s$, represent mappings between each sensor in isolation against the Standard and while measuring across a self-load, for mutual calibration via the Relative method, a displacement matrix, D, is used and represents a calibration of the two calibrated sensors when referenced against the other when they are operating across (on opposing sides of) a "mutual load" (or between one of the calibrated sensors and the Standard when the Standard is arranged on an opposing side of the mutual load—in the Absolute method). In essence the mutual calibration procedure that will be described below aligns the currents and voltages measured at the secondary sensor with those measured at the primary sensor, or vice versa, in a relative way when the alignment between these values is inconsistent during interoperation under boundary conditions imposed by the mutual load. In other words, the displacement matrix, D, further accounts for errors between two calibrated sensors, each of which still displays some error, albeit within certain tolerances.

The result of Relative mutual calibration is a modification to either the first or second self-calibration matrix, $K_p$, $K_s$, to account for errors between the two sensors, which are otherwise individually in tolerance. Namely, application of the displacement matrix to the second sensor gives a modified self-calibration matrix:

$$K_{S'}=K_S D \quad \text{(Equation 7)}$$

Or to the first sensor gives a modified self-calibration matrix:

$$K_{P'}=K_P D \quad \text{(Equation 8)}$$

Although this modification or displacement matrix, D, can be applied to the self-calibration matrix for either sensor, for simplicity, the remainder of this discussion will focus on the Relative method applied to the second sensor and the use of Equation 7. This can be referred to as the first Relative method. However, those of skill in the art will equally be able to work with mutual calibration as applied to Equation 8 and the first sensor—the second Relative method.

The following discussion will reference FIGS. 19 and 21 in conjunction with discussion of the Relative method.

Finding values for the D matrix (see Equation 9 below) can occur after the self-loads have been removed (Blocks 1908 and 1916) and by arranging the mutual load between the two sensors as seen in FIGS. 12B, 12C and 14-15 (Block 1918 and 2102). The following paragraph will focus on the first Relative method shown in FIG. 12B, but one of skill can apply this method to the second Relative method exemplified by FIG. 12C. The controller 812 can again set (or maintain) the match variables to the primary preset 815 (Block 2104). The reference power 816 can be coupled to the match input 828 of the match network 802 and turned on (Block 2106). Both sensors can take current and voltage measurements, $V_p$, $I_p$, $V_s$, $I_s$ at nodes P and S in FIG. 14 (Blocks 2108, 2110). While FIG. 12A provides an illustration of a system for performing mutual calibration using a mutual load arranged between the first and second sensors of the match, FIGS. 12B and 14 provide theoretical views of the system of FIG. 12A with an error model M arranged between the mutual load and the second sensor 810. Measurements $I_s$ and $V_s$ are the current and voltage measured at the second sensor 810 (Block 2110). Derived current and voltage, $-I_{s'}$ and $V_{s'}$ can be assigned to node S' between the mutual load and the error model M. Although these values cannot be directly measured at node S' (unless a Standard is placed at S'), they can be inferred/derived from knowledge of the mutual load (a matrix N) and measurements of $I_p$, $V_p$, at node P (Block 2108). These derived values will be replaced by functions of the measured current and voltage, $I_p$, $V_p$, $I_s$, $V_s$ later in this discussion.

An N matrix can be determined from the mutual load topology (Block 2112 and see Equations 12-15 below) at any time after the mutual load is known. Given the N matrix and the measured data at nodes P and S (Block 2114), an admissible M type matrix can be selected (Block 2116) and a secondary M extraction solution for the x and y vector can be selected (Block 2118). Equation 21 can then be used to find the B matrix (Block 2120) and the M matrix can be extracted from the N and B matrices (Block 2122). The D matrix can then be found using Equation 9, $R_0$ and the M matrix (Block 2124). The displacement matrix, D, can then be multiplied by the secondary self-calibration matrix, $K_s$, to give a modified self-calibration matrix $K_{s'}$ (Block 2126 and Equation 7). This completes Block 1920a and the relative method of determining the modified self-calibration matrix, $K_{s'}$, which can now be stored in the match memory (Block 1922). In embodiments that will be later described, an Absolute method of determining the modified self-calibration matrices, $K_{p'}$ and $K_{s'}$ can be implemented (Block 1920b) instead of the Relative method (Block 1920a). The mutual load (and optionally the Standard) can be removed (1924), thus ending the calibration phase of FIG. 19.

Figure 15:
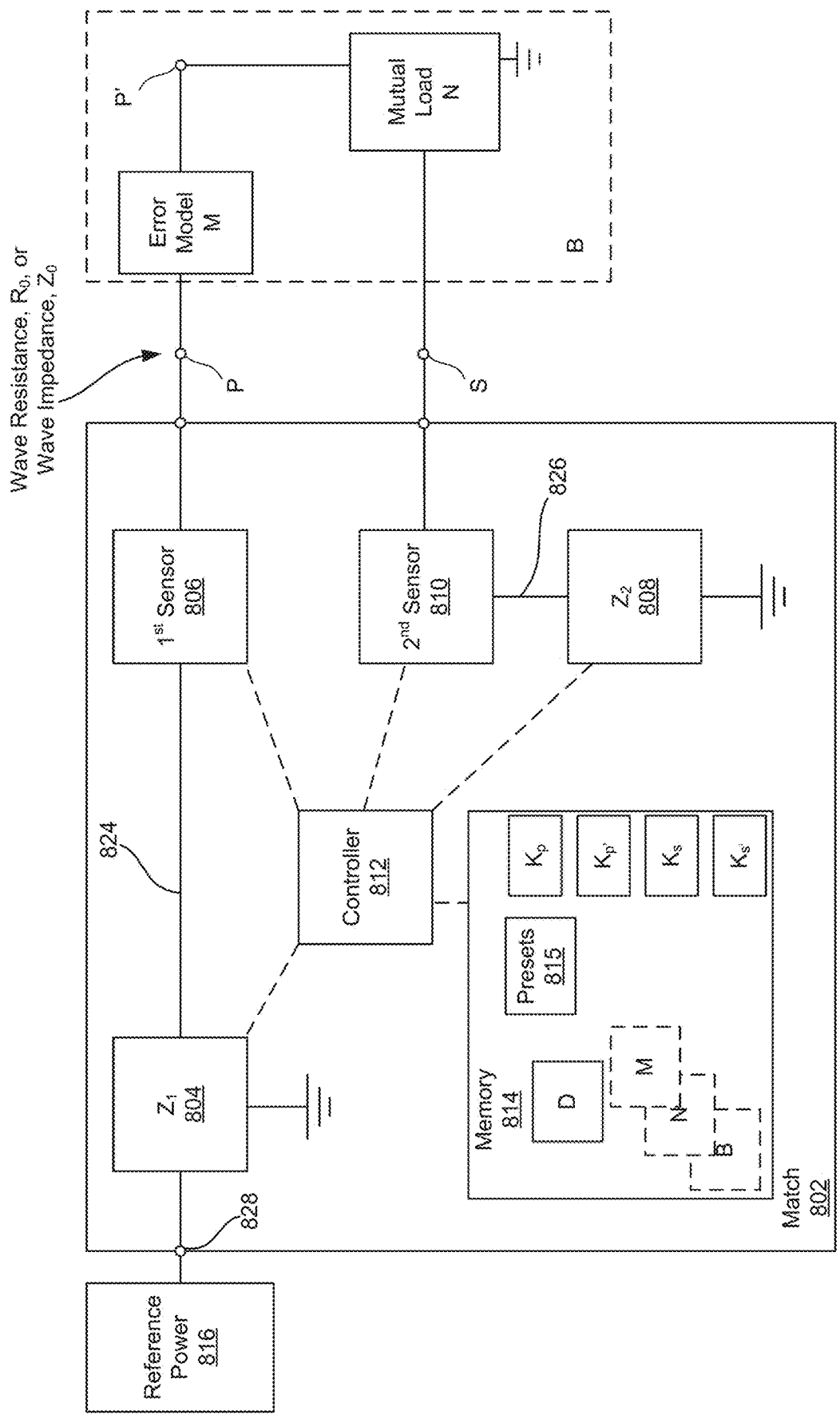
FIG. 15 illustrates a circuit diagram of a match network being calibrated via a second Relative calibration method including a mutual load represented by matrix N and an error model M.

Although this discussion has described a first relative method as applied to modifying the second self-calibration matrix, $K_s$, one of skill in the art can also apply this Relative method to modify the first self-calibration matrix, $K_p$, and the use of Equation 8. FIGS. 12C and 15 applied in that situation. The following provides further details of the matrices used in the Relative method—whether applied to $K_s$ or $K_p$.

The M and D Matrices

Regardless as to whether the displacement matrix D is being applied to the primary or secondary sensor, it can be defined as:

$$D = \Omega M \Omega^{-1} \quad \text{(Equation 9)}$$

Where $\Omega$ is defined as $$\Omega = \frac{1}{2}\begin{bmatrix} 1 & R_0 \\ 1 & -R_0 \end{bmatrix} \quad \text{(Equation 10)}$$

For real wave resistance, $R_0$. Application to complex impedance can be achieved by using complex impedance, $Z_0$, instead of $R_0$, as will be discussed in later section called Complex Wave Impedance. The M matrix in Equation 9 can be determined as:

$$M = N^- B^{-1} \quad \text{(Equation 11)}$$

To better understand the M, N, and B matrices, one can look to FIGS. 12B and 12C where the M matrix represents an error between the S and S' nodes or the P and P' nodes, respectively, the N matrix represents the mutual load, and the B matrix represents everything between the P and S nodes and thus a mapping between those nodes. The solution to Equation 11 can be found using Equations 12 and 21 below.

The N and B Matrices

The B matrix maps the signal pairs $V_p$ and $I_p$ to $V_s$ and $I_s$, while accounting for errors captured in the error model. The N matrix maps the signal pairs $V_p$ and $I_p$ to $V_{s'}$ and $I_{s'}$ (FIG. 12B) or $V_s$ and $I_s$ to $V_{p'}$ and $I_{p'}$ (FIG. 12C), and represents boundary conditions or the topology of the mutual load. The N matrix is derived for a given mutual load topology as will be discussed in more detail below. The M matrix maps the signal pairs $V_{s'}$ and $I_{s'}$ to $V_s$ and $I_s$ (FIG. 12B) or $V_p$ and $I_p$ to $V_{p'}$ and $I_{p'}$ (FIG. 12C), and contains error terms that quantify error or misalignment between the first and second sensor (errors that will be cured by mutual calibration). Use of the M matrix makes measurements at the nodes before and after the error model (represented by matrix M) indistinguishable (e.g., $V_s$ is replaced by $V_{s'}$ and $I_s$ replaced by $I_{s'}$ in the post calibration functioning of the match).

The N matrix describes the topology of the mutual load and can be written as:

$$N = E T_1 E \quad \text{(Equation 12)}$$

Where the E matrix is:

$$E = \begin{bmatrix} 1 & 0 \\ 0 & -1 \end{bmatrix} \quad \text{(Equation 13)}$$

And the $T_1$ matrix is derived from a matrix, $S_i$, for series elements, and a matrix, $P_j$, for parallel elements. These matrices can be written as:

$$S_i = \begin{bmatrix} 1 & z_i \\ 0 & 1 \end{bmatrix} \quad \text{(Equation 14)}$$

$$P_i = \begin{bmatrix} 1 & 0 \\ y_j & 1 \end{bmatrix} \quad \text{(Equation 15)}$$

By multiplying representative matrices for the elements in a given mutual load, one can derive a $T_1$ matrix for any mutual load topology. For instance, if the mutual load has a series element, then the $T_1$ matrix is $$\begin{bmatrix} 1 & z_i \\ 0 & 1 \end{bmatrix},$$

where $z_i$ is the impedance of the series element (e.g., an inductor or capacitor). For an LC series circuit used as the mutual load, the $T_1$ matrix would be $$\begin{bmatrix} 1 & z_L \\ 0 & 1 \end{bmatrix}\begin{bmatrix} 1 & z_C \\ 0 & 1 \end{bmatrix} = \begin{bmatrix} 1 & z_L + z_C \\ 0 & 1 \end{bmatrix},$$

where $z_C$ is the impedance of the capacitor and $z_L$ is the impedance of the inductor. For a parallel circuit with an L and C in parallel, the $T_1$ matrix would be $$\begin{bmatrix} 1 & 0 \\ y_L & 1 \end{bmatrix}\begin{bmatrix} 1 & 0 \\ y_C & 1 \end{bmatrix} = \begin{bmatrix} 1 & 0 \\ y_L + y_C & 1 \end{bmatrix},$$

where $y_L$ is the admittance of the inductor and $y_C$ is the admittance of the capacitor. As seen, the $T_1$ matrix, and thus the N matrix, will depend on the mutual load topology, and thus any solution for the displacement matrix, D, begins with finding a corresponding $T_1$ matrix. With the $T_1$ matrix derived for a given mutual load, one can determine the N matrix by inserting the derived $T_1$ into Equation 12. For instance, for a mutual load comprising a single inductor, the N matrix is:

$$N = E T_1^{-1} E = \begin{bmatrix} 1 & 0 \\ 0 & -1 \end{bmatrix}\begin{bmatrix} 1 & z_I \\ 0 & 1 \end{bmatrix}\begin{bmatrix} 1 & 0 \\ 0 & -1 \end{bmatrix} = \begin{bmatrix} 1 & -z_I \\ 0 & 1 \end{bmatrix}$$

And the B matrix can be determined by (1) constructing a matrix X from measured signals $V_p$, $I_p$; (2) constructing a matrix Y from measured signals $V_s$, and $I_s$; and (3) constructing the B matrix from X and Y as $YX^{-1}$. The derivation of the B matrix is as follows. A matrix $h_p$ can be formed as:

$$h_p = \begin{bmatrix} V_p \\ -I_p \end{bmatrix} \quad \text{(Equation 16)}$$

And a matrix X can be formed as:

$$X = \begin{bmatrix} V_p & x_1 \\ -I_p & x_2 \end{bmatrix} \quad \text{(Equation 17)}$$

Where $x_1$ and $x_2$ are known data determined from given and derived data and are known to meet the structure of matrix M. More specifically, FIG. 22 provides details of a method to determine the x vector (i.e., $x_1$ and $x_2$). The inverse matrix of X can be formed as $$X^{-1} = \begin{bmatrix} x_2 & -x_1 \\ I_p & V_p \end{bmatrix}\frac{1}{d_x} \quad \text{(Equation 18a)}$$

Where, $$d_x = v_p x_2 + I_p x_1 \neq 0 \quad \text{(Equation 18b)}$$

One can measure $V_s$ and $I_s$ and derive a matrix $h_s$ as:

$$h_s = \begin{bmatrix} V_s \\ I_s \end{bmatrix} \quad \text{(Equation 19)}$$

And a matrix Y as:

$$Y = \begin{bmatrix} V_s & y_1 \\ I_s & y_2 \end{bmatrix} \quad \text{(Equation 20a)}$$

Where $y_1$ and $y_2$ are known data determined from given and derived data and are known to meet the structure of matrix M. More specifically, FIG. 22 provides details of a method to determine the y vector (i.e., $y_1$ and $y_2$). It should also be noted that:

$$d_y = v_s y_2 - I_s y_1 \neq 0 \quad \text{(Equation 20b)}$$

The B matrix can then be found as:

$$B = YX^{-1} = \begin{bmatrix} V_s & y_1 \\ I_s & y_2 \end{bmatrix} \begin{bmatrix} V_p & x_1 \\ -I_p & x_2 \end{bmatrix}^{-1} \quad \text{(Equation 21)}$$

Note that B maps the first column of X into the first column of Y.

The following is an example for finding B, and assumes $V_p=1$, $I_p=-1$, $V_s=2$, and $I_s=-2$, $$h_p = \begin{bmatrix} 1 \\ 1 \end{bmatrix},$$

$$X = \begin{bmatrix} 1 & 0 \\ 1 & 1 \end{bmatrix},$$

$$X^{-1} = \begin{bmatrix} 1 & 0 \\ -1 & 1 \end{bmatrix},$$

$$h_s = \begin{bmatrix} 2 \\ -2 \end{bmatrix},$$

$$Y = \begin{bmatrix} 2 & 0 \\ -2 & 1 \end{bmatrix},$$

$$B = \begin{bmatrix} 2 & 0 \\ -2 & 1 \end{bmatrix}\begin{bmatrix} 1 & 0 \\ -1 & 1 \end{bmatrix} = \begin{bmatrix} 2 & 0 \\ -3 & 1 \end{bmatrix}, \text{ and}$$

$$B^{-1} = \begin{bmatrix} 1 & 0 \\ 3 & 2 \end{bmatrix}\frac{1}{2}.$$

To summarize, for the Relative method, one either solves Equation 7 or 8, depending on the location of the sensor to be modified. This means solving for the D matrix, given by Equation 9, which depends on the Ω and M matrices as found by Equations 10 and 11. Equation 10 is solved by measured values for $R_0$, and M is a function of the N and B matrices as shown in Equation 11. N is given by Equations 12-15 and B is found as Equation 21 and is a function of the Y and X matrices as found in Equations 17 and 20a. In this way, the D matrix can be solved for.

From Equation 17 one can see that the second column of X is $x=[x_1, x_2]'$ and the second column of Y is $y=[y_1, y_2]'$. The entries of x and y appear in $d_x$ and $d_y$ each of which should be nonzero. Such choices also have an effect on the structure of M as an outcome. The following discusses methods to select x and y vectors, though a discussion of Admissibility is a necessary precursor to that discussion.

Admissibility

The methods disclosed herein are applicable to most situations with the exclusion of the primary voltage, $V_p$, and the primary current, $I_p$, being 0, simultaneously. In other words, mutual calibration is effective where there is a current and voltage between the first sensor 806 and the self-load or mutual load. More specifically, this generalized concept can be considered through admissibility. No data is admissible in the use case at hand with $V_p=I_p=0$ or $V_s=I_s=0$. That is, no data is valid as it pertains to the methods described herein wherein the entire first column of X (see Equation 17) is the zero vector or the entire first column of Y (see Equation 20a) is the zero vector. Such data is referred to in short as "inadmissible." The following chart provides further details of admissibility on a wider basis. This chart is exemplary and applies to any pair of vectors: one at the input of a B matrix to be determined; and one at the output. The methods in this disclosure assume that the data is admissible.

Admissibility Chart

| | Input | | Output | | |
|---|---|---|---|---|---|
| | $V_T$ | $I_T$ | $V_W$ | $I_W$ | |
| Inadmissible Cases | 0 | 0 | 0 | 0 | |
| | 0 | 0 | 0 | ≠0 | |
| | 0 | 0 | ≠0 | 0 | |
| | 0 | 0 | ≠0 | ≠0 | |
| | 0 | ≠0 | 0 | 0 | |
| | ≠0 | 0 | 0 | 0 | |
| | ≠0 | ≠0 | 0 | 0 | |
| Admissible Cases | 0 | ≠0 | 0 | ≠0 | Case 3 |
| | 0 | ≠0 | ≠0 | ≠0 | Case 1 |
| | ≠0 | 0 | ≠0 | 0 | Case 6 |
| | ≠0 | 0 | ≠0 | ≠0 | Case 4 |
| | ≠0 | ≠0 | 0 | ≠0 | Case 2 |
| | ≠0 | ≠0 | ≠0 | 0 | Case 5 |
| | ≠0 | ≠0 | ≠0 | ≠0 | Case 0 |
| Additional Admissible Cases | 0 | ≠0 | ≠0 | 0 | Case 7 |
| | ≠0 | 0 | 0 | ≠0 | Case 8 |

Where the T and W subscripts correspond to pairs of nodes in the figures (e.g., P and S, P and P', or S' and S).

Admissible cases result in an M diagonal, upper, or lower triangular, which are more familiar matrix forms. Additional admissible cases apply where M is of the form $$\begin{bmatrix} \gamma & \delta \\ \propto & 0 \end{bmatrix} \text{ or } \begin{bmatrix} 0 & \delta \\ \infty & \beta \end{bmatrix}.$$

These forms are defined herein, and the terminology is unique to this disclosure. They are termed Northwest (NW) Triangular, and Southeast (SE) Triangular, respectively.

Choice of x and y Vectors

This discussion reflects the flow seen in FIG. 22, which provides an embodiment of details of Block 2116 and 2118 in FIG. 21. Given matrix N (recall Equations 12-15), and measured values for $V_p$, $I_p$, $V_s$, and $I_s$, x and y vectors can be selected that lead to an M matrix in one of the following three more familiar forms: diagonal $$\left(M = \begin{bmatrix} \gamma & 0 \\ 0 & \beta \end{bmatrix}\right),$$

upper triangle $$\left(M = \begin{bmatrix} \gamma & \delta \\ 0 & \beta \end{bmatrix}\right),$$

or lower triangle $$\left(M = \begin{bmatrix} \gamma & 0 \\ \infty & \beta \end{bmatrix}\right).$$

These are exemplary as results. Additional results can be compiled for North West triangular and South East triangular, and should not be excluded.

Before moving on, it is helpful to state some relationships which are useful across all admissible matrix forms for M.

$B = N^{-1} + \Sigma$ (Equation 22)

$BN = M^{-1}$ (Equation 23)

$1 + \Sigma N = M^{-1}$ (Equation 24)

$\Sigma$ is a matrix which represents the difference between the B matrix that we want to construct and the N matrix which is given by Equations 12-15. Absent errors, $\Sigma = 0$ results and $B = N^{-1}$ results which is to be expected. The $\Sigma$ matrix permits one to parameterize the analysis in a useful way and simplifies previous developments.

M as a Diagonal Matrix

Where x and y are selected such that M is a diagonal matrix, they must satisfy the following system of equations:

$$\begin{bmatrix} \frac{-d}{\gamma}I_p & \frac{b}{\gamma}I_p & I_p & 0 \\ 0 & 0 & 0 & 0 \\ \frac{c}{\beta}I_p & \frac{-a}{\beta}I_p & 0 & I_p \\ 0 & 0 & 0 & 0 \end{bmatrix} \begin{bmatrix} x_1 \\ x_2 \\ y_1 \\ y_2 \end{bmatrix} = \begin{bmatrix} 0 \\ 0 \\ 0 \\ 0 \end{bmatrix}$$

Case 0, 3, and 6. There are two solutions:

$$z^{(1)} = x_2 \left[1, \frac{d}{b}, 0, \frac{1}{b\beta}\right]', x_1 \neq 0$$

where $$x_2 = \frac{x_1 d}{b}, y_1 = 0, \text{ and } y_2 = \frac{x_1}{b\beta},$$

and $$z^{(2)} = x_1 \left[1, \frac{c}{a}, \frac{1}{\gamma}, 0\right]', x_1 \neq 0$$

where $$x_2 = \frac{cx_1}{a}, y_1 = \frac{x_1}{\gamma},$$

and $y_2 = 0$.

$V_{s'}$ and $I_{s'}$ are derived data and are obtained from the elements of the first column of X (Equation 17), which is measured data, and the elements of matrix N, which are given data from Equations 12-15. Three cases align with admissibility for this type of M matrix, cases 0, 3, and 6.

For case 0, $\gamma$ is determined from the ratio of $V_{s'}$ to $V_s$ since each is non-zero. The same applies to $\beta$, which is determined from the ratio of $I_{s'}$ to $I_s$. Here, $$\gamma = \frac{V_{s'}}{V_s} \text{ and } \beta = \frac{-I_{s'}}{s}.$$

For case 3, one simply chooses $\gamma = 1$, since $V_s = V_s = 0$. For case 6, one simply chooses $\beta = 1$, since $I_s = I_s = 0$.

M as an Upper Triangular Matrix

Where x and y are selected such that M is an upper triangular matrix, they must satisfy the following system of equations:

$$\begin{bmatrix} -\left(\frac{d}{\gamma} + \frac{c}{\gamma}\frac{\delta}{\beta}\right)I_p & \left(\frac{b}{\gamma} + \frac{a}{\gamma}\frac{\delta}{\beta}\right)I_p & I_p & 0 \\ 0 & 0 & 0 & 0 \\ 0 & 0 & 0 & I_p \\ 0 & 0 & 0 & 0 \end{bmatrix} \begin{bmatrix} x_1 \\ x_2 \\ y_1 \\ y_2 - \frac{a}{\beta}x_2 + \frac{c}{\beta}x_1 \end{bmatrix} = \begin{bmatrix} 0 \\ 0 \\ 0 \\ 0 \end{bmatrix}$$

Cases 1 and 2. There are two solutions:

$$z^{(1)} = x_2 \left[0, 1, -\left(\frac{b}{\gamma} + \frac{\delta a}{\gamma \beta}\right), \frac{a}{b}\right]', x_2 \neq 0$$

Where, $x_1 = 0$, $$y_1 = -\left(\frac{b}{\gamma} + \frac{\delta a}{\gamma \beta}\right)x_2, \text{ and } y_2 = \frac{a}{\beta}x_2,$$

and $$z^{(2)} = x_1 \left[1, 0, \left(\frac{d}{\gamma} + \frac{\delta c}{\gamma \beta}\right)x_1, -\frac{c}{b}\right]', x_1 \neq 0$$

Where, $x_2 = 0$, $$y_1 = \left(\frac{d}{\gamma} + \frac{\delta c}{\gamma \beta}\right)x_1, \text{ and } y_2 = \frac{-c}{\beta}x_1.$$

$V_{s'}$ and $I_{s'}$ are derived data and are obtained from the elements of the first column of X (Equation 17), which is measured data, and the elements of matrix N, which are given data from Equations 12-15. Two cases align with admissibility for this type of M matrix. They are cases 1 and 2. For case 1, $$\delta = -\frac{V_{s'}}{I_s}$$

and $V_s'=0$. For case 2, $$\delta = -\beta \frac{V_{s'}}{I_s}$$

and $V_s=0$. For both cases 1 and 2 $\gamma=1$ and $$\beta = \frac{I_{s'}}{I_s}.$$

M as a Lower Triangular Matrix

Where x and y are selected such that M is a lower triangular matrix, they must satisfy the following system of equations:

$$\begin{bmatrix} 0 & 0 & I_p & 0 \\ 0 & 0 & 0 & 0 \\ \left(\frac{c}{\beta}+\frac{d}{\gamma}\frac{\alpha}{\beta}\right)I_p & \left(\frac{a}{\beta}+\frac{\alpha}{\gamma}\frac{b}{\beta}\right)(-I_p) & 0 & I_p \\ 0 & 0 & 0 & 0 \end{bmatrix} \begin{bmatrix} x_1 \\ x_2 \\ y_1 \\ y_1 - \frac{d}{\gamma}x_1 + \frac{b}{\gamma}x_2 \end{bmatrix} = \begin{bmatrix} 0 \\ 0 \\ 0 \\ 0 \end{bmatrix}$$

Cases 4 and 5. There are two solutions:

$$z^{(1)} = x_2\left[0, 1, -\frac{b}{\gamma}, \left(\frac{a}{\beta}+\frac{\alpha}{\beta}\frac{b}{\gamma}\right)', x_2\right] \neq 0$$

Where, $x_1=0$, $$y_1 = -\frac{b}{\gamma}x_2, \text{ and } y_2 = \left(\frac{a}{\beta}+\frac{\alpha}{\beta}\frac{b}{\gamma}\right)x_2,$$

and $$z^{(2)} = x_1\left[1, 0, \frac{d}{\gamma}, -\left(\frac{c}{\beta}+\frac{d}{\gamma}\frac{\alpha}{\beta}\right)', x_1\right] \neq 0$$

Where, $x_2=0$, $$y_1 = \frac{d}{\gamma}x_1, \text{ and } y_2 = -\left(\frac{c}{\beta}+\frac{d}{\gamma}\frac{\alpha}{\beta}\right)x_1.$$

$V_s'$ and $I_s'$ are derived data and are obtained from the elements of the first column of X (Equation 17), which is measured data, and the elements of matrix N, which are given data from Equations 12-15. $\gamma$ is determined from $V_s$ and $V_{s'}$ and $\beta=1$ suffices. Two cases align with admissibility for this type of M matrix, cases 4 and 5. For case 4, $$\alpha = -\frac{I_s}{V_s}$$

and $I_s+=0$. For case 5, $$\alpha = -\beta \frac{I_{s'}}{V_s}$$

and $V_s=0$. For both cases 4 and 5

$$\gamma = \frac{V_{s'}}{V_s}$$

and $\beta=1$.

Concluding First Relative Method

It should be noted that $x_1$, $x_2$, $y_1$, and $y_2$ are data based. When $d_x$ is populated with $x_1$ and $x_2$ obtained for the M matrix types considered above or otherwise, in each case $dx \neq 0$ will be the case as required. Likewise, when dy is populated with $y_1$ and $y_2$ obtained for the M matrix types considered above or otherwise, in each case $dy \neq 0$ will be the case as required. Matrix D can then be determined by populating Equation 9 in each circumstance and multiplying $K_s$ by D to complete mutual calibration (for the first Relative method).

FIG. 22 illustrates a method for selecting the x and y vectors that can then be used in Equations 17 and 20A (or Equation 21) to solve for the displacement matrix D (Equations 11 and 9). The method 2200 begins by forming a first column of X using the measurements for $V_p$ and $I_p$ (Block 2202) and then populates the second column of X with $x_1$ and $x_2$ data (Block 2204). The method 2200 then forms a first column of Y using measurements for Vs, and Is (Block 2206) and then populates the second column of Y with $y_1$ and $y_2$ data (Block 2208). The method 2200 then predetermines the form of the M matrix from the admissibility chart (Block 2210) and obtains the solutions for $x_1$, $x_2$, $y_1$, and $y_2$ for the chosen form of the matrix M (Block 2212). Then, given the N matrix (see Equations 12-15), the method 2200 determines $V_{s'}$ and $I_{s'}$ from $V_p$ and $I_p$ (Block 2214), uses the secondary M extraction calculation tool (Block 2216), and determines M parameters $\alpha$, $\beta$, $\gamma$, and $\delta$ (Block 2218). Finally, the method 2200 ensures that $dx \neq 0$ and $dy \neq 0$ results for the solutions for $x_1$, $x_2$, $y_1$, and $y_2$, obtained and populated into Equations 18A and 20A (Block 2220).

So far this discussion of the Relative method has assumed an error model between the second sensor and the mutual load. However, an alternative Relative method can also be implemented with the error model arranged between the mutual load and the first sensor. Although details of this second Relative method are not provided, those of skill in the art can easily apply the above discussion to this alternative conceptualization of the Relative method.

B. Absolute Method

Figure 16:
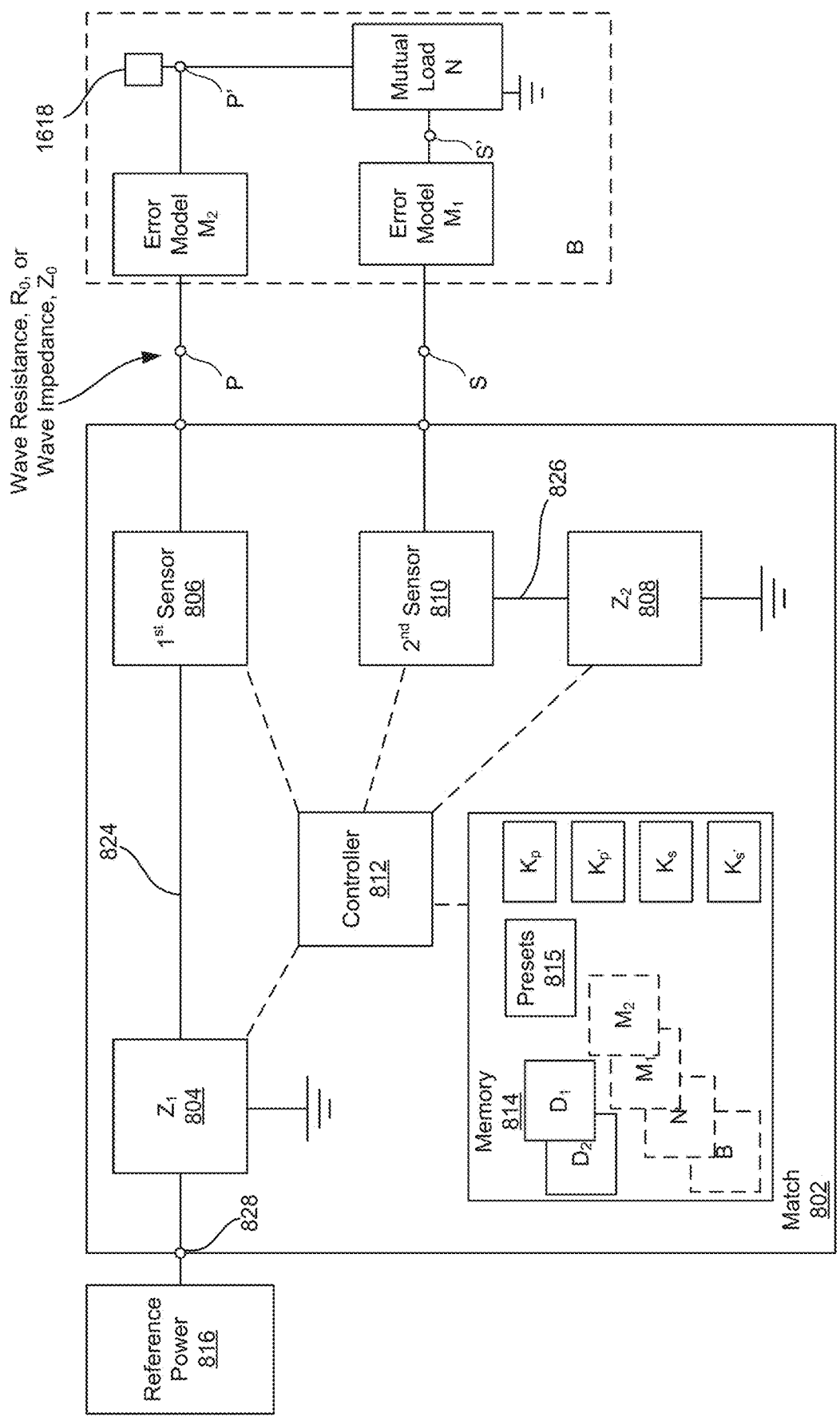
FIG. 16 illustrates a circuit diagram of a match network being calibrated via a first Absolute calibration method including a mutual load represented by matrix N, a reference sensor, and two error models $M_1$ and $M_2$.
Figure 17:
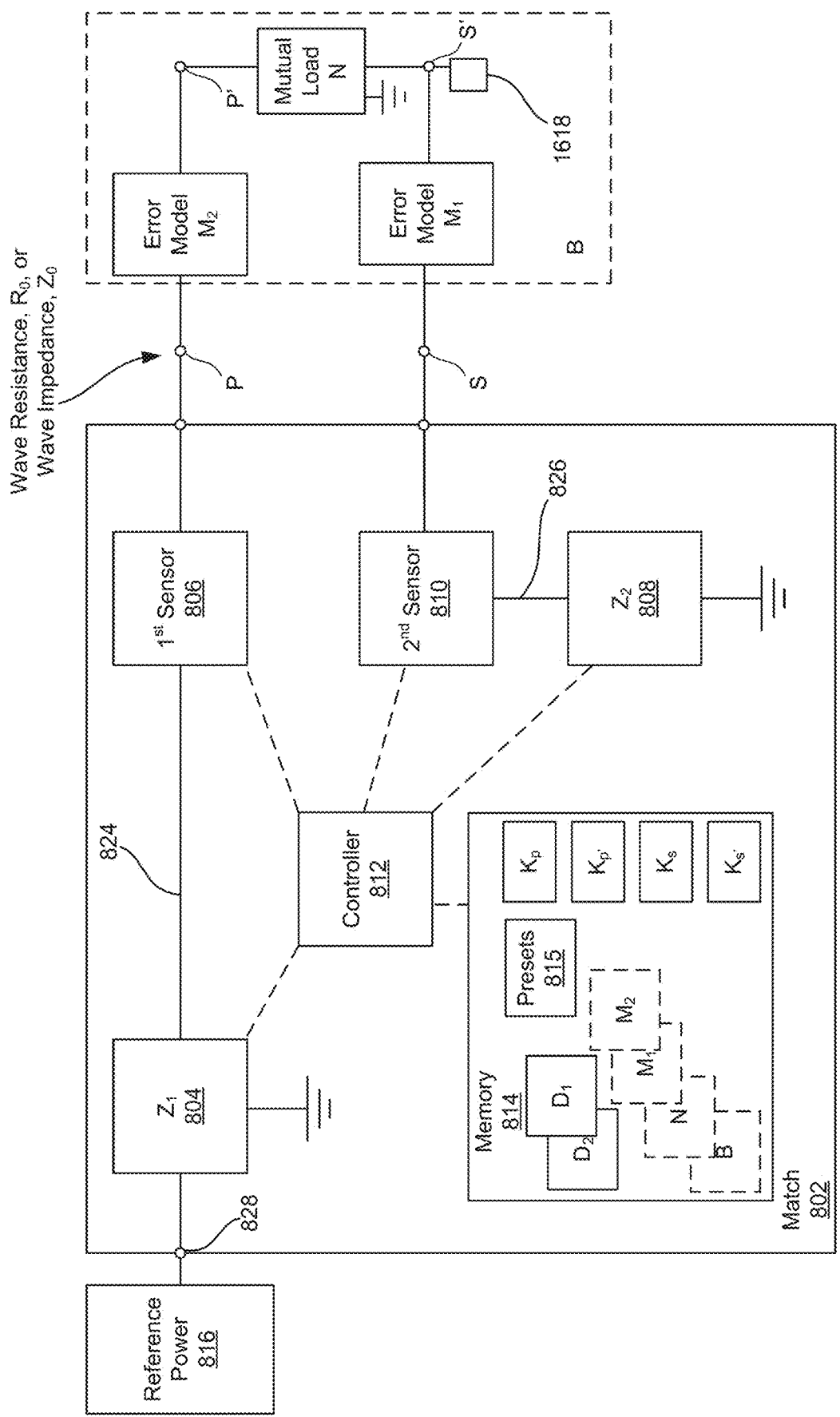
FIG. 17 illustrates a circuit diagram of a match network being calibrated via a second Absolute calibration method including a mutual load represented by matrix N, a reference sensor, and two error models $M_1$ and $M_2$.

It may be appreciated that comparing the two calibrated sensors is virtually the same as comparing one of the calibrated sensors to a reference sensor 818, 1202, 1618. For this reason, FIGS. 12D and 12E, 16, and 17 show topologies where the reference sensor is arranged between the first sensor 806 and the mutual load (FIGS. 12D and 16) or between the second sensor 810 and the mutual load (FIGS. 12E and 17). To simplify this discussion, we focus on a system where the reference sensor 1202, 1618 is arranged between the first sensor 806 and the mutual load (called a first Absolute method), though this discussion is easily applied to a reference sensor 1202, 1618 arranged between the second sensor 810 and the mutual load (called a second Absolute method).

When speaking of the Absolute method, the displacement matrix, D, takes the form of two matrices, $D_1$ and $D_2$, and two error models, $M_1$ and $M_2$ are used instead of one. While using the reference sensor 1202, 1618 in the mutual calibration may be more complex than merely comparing the calibrated sensors, it provides greater precision and accuracy. However, either the Relative or Absolute methods of mutual calibration provide significant improvements over prior systems and methods. It should be noted that where the reference sensor 1202, 1618 is used in mutual calibration, measurements from the adjacent sensor, provide opportunities to determine the additional error models, $M_1$ and $M_2$. This is provided by comparing measurements made at an adjacent sensor to those made by a reference sensor (e.g., measurements at nodes P and P' in FIGS. 12D and 16 for the first Absolute method or measurements at nodes S and S' in FIGS. 12E and 17 for the second Absolute method). $M_1$ and $M_2$ each relate to two new displacement matrices $D_1$ and $D_2$, respectively, in the same manner as D and M relate in the Relative method.

In more detail, FIGS. 12D, 12E, 16 and 17 include a second error model $M_2$ in series between the reference sensor 1202, 1618 and the first sensor 806, and a first error model $M_1$ in series between the mutual load and the second sensor 810. Power is delivered from a power source, such as an RF power generator, via a match input 828, and delivered to a plasma processing chamber 1202 via an output 822, with power returning to ground via a plasma return input 823. The first sensor 806 can be coupled to a first electrical path 824 between the match input 828 and the output 822, and the second sensor 810 can be coupled to a second electrical path 826 between the plasma return input 823 and a ground connection.

The second error model $M_2$ provides a theoretical way to explain why the first sensor 806 and the reference sensor 1618 don't provide identical measurements even though they are physically at the same node and thus under ideal circumstances should measure the same current and voltage. To further help with this abstraction, the error model $M_2$ sits between two nodes P and P', and the reference sensor 1618 is arranged at the second primary node P'. In this embodiment, the B matrix maps the signal pairs $V_p$ and $I_p$ to $V_s$ and $I_s$, while accounting for errors in the error model, $M_2$. The N matrix maps the signal pairs $V_{p'}$ and $I_{p'}$ to $V_{s'}$ and $I_{s'}$, and represents boundary conditions which arise from the topology of the mutual load. The N matrix is derived for a given mutual load topology as discussed earlier. In contrast to FIGS. 14 and 15, here instead of a single M matrix, there are two M matrices, $M_1$ and $M_2$ in FIGS. 16 and 17. $M_2$ represents an error model between the reference sensor and the first sensor 806, while $M_1$ represents an error model between the mutual load and the second sensor 810. The $M_1$ matrix maps the signal pairs $V_{s'}$ and $I_{s'}$ to $V_s$ and $I_s$. The $M_2$ matrix maps the signal pairs $V_p$ and $I_p$ to $V_{p'}$ and $I_{p'}$.

More specifically, a method 2300 as shown in FIG. 23 can be used to determine the modified self-calibration matrices $K_S$, and $K_P$, using the reference sensor (e.g., 1202, 1618). The method 2300 starts by finding $M_2$ and then using the Relative algorithm to find $M_1$, but those of skill in the art will also be able to use these descriptions to first find $M_1$ and then use the Relative algorithm to find $M_2$.

M2 Primary Extraction

The following method 2300 starts with determination of $M_2$ and then determines $M_1$ reusing the Relative method from earlier. Reference to FIGS. 12D and 16 can be made for the system equivalents to this method 2300. However, this method 2300 can also be applied where the reference sensor is arranged on the opposing side of the mutual load and $M_1$ is first determined followed by the use of the Relative method to determine $M_2$ (see FIGS. 12E and 17 and changes to FIG. 23 including $M_2 \rightarrow M_1$, $M_1 \rightarrow M_2$, $B_2 \rightarrow B_1$). In either case, once $M_1$ and $M_2$ are known, the displacement matrices, $D_1$ and $D_2$ can be found, and from there the modified displacement matrices, $K_{1'}$ and $K_{2'}$ can be found.

The method 2300 includes arranging the reference sensor between the mutual load and the first sensor (Block 2302) at node P'. The method 2300 can set match variable components to the presets (Block 2304), if they are not already there, apply a reference power to the match input (Block 2306) and measure $V_{p'}$, $I_{p'}$ (real/complex wave power and reflected power) using the reference sensor at node P' (Block 2308) and measure $V_p$, $I_p$ (real/complex wave power and reflected power) using the first sensor at node P (Block 2308). Measurements with the first sensor and the reference sensor should be made at the same time. From these measurements at nodes P and P', the $B_2$ matrix (i.e., $B_2 = M_2^{-1}$) can be determined assuming admissibility for solutions of $x_1, x_2, y_1, y_2$ by (1) constructing matrix X from the measured signal pair, $V_s$, $I_s$, and (2) constructing matrix Y from the measured signal pair $V_p$, $I_p$, and (3) constructing the $B_2$ matrix as $YX^{-1}$ (Block 2310). This gives a $B_2$ matrix as:

$$B_2 = YX^{-1} = \begin{bmatrix} V_{p'} & y_1 \\ -I_{p'} & y_2 \end{bmatrix} \begin{bmatrix} x_2 & -x_1 \\ I_p & V_p \end{bmatrix} \frac{1}{d_x} \qquad \text{(Equation 25)}$$

Further details of Block 2310 will be discussed below, including selection of the admissible error matrix M type and selection of x and y vector solutions.

Choice of x and y Vectors (Details of Block 2310)

Given matrix N (recall Equations 12-15), and measured values for $V_p$, $I_p$, $V_{p'}$, and $I_{p'}$, x and y vectors can be selected that lead to an $M_2$ matrix in one of the following three forms: diagonal $$\left( M_2 = \begin{bmatrix} \gamma & 0 \\ 0 & \beta \end{bmatrix} \right),$$

upper triangle $$\left( M_2 = \begin{bmatrix} \gamma & \delta \\ 0 & \beta \end{bmatrix} \right),$$

or lower triangle $$\left( M_2 = \begin{bmatrix} \gamma & 0 \\ \alpha & \beta \end{bmatrix} \right).$$

These are exemplary as results are also compiled for North West triangular and South East triangular, and should not be excluded.

$M_2$ as a Diagonal Matrix

Where x and y are selected such that M is a diagonal matrix, they must satisfy the following system of equations:

$$\begin{bmatrix} F_v & 0 & V_p & 0 \\ 0 & F_I & 0 & I_p \\ 0 & -F_v & I_p & 0 \\ -F_I & 0 & 0 & V_p \end{bmatrix} \begin{bmatrix} x_1 \\ x_2 \\ y_1 - \hat{a}x_1 \\ y_2 - \hat{b}x_2 \end{bmatrix} = \begin{bmatrix} 0 \\ 0 \\ 0 \\ 0 \end{bmatrix}$$

Where $F_v \triangleq -V_{p'} + \hat{a}V_p$ and $F_I \triangleq -I_{p'} + \hat{b}I_p$ and $$\gamma \frac{1}{-\hat{a}} \text{ and } \beta = \frac{1}{\hat{b}}.$$

The given data suggests three cases: cases 0, 3, and 6.

Case 0. Find:

$$\gamma = \frac{V_p}{V_{p'}}$$

Find:

$$\beta = \frac{I_p}{I_{p'}}$$

Choose any $x_1$ and $x_2$ subject to $$dx = V_p x_2 + I_p x_1 \neq 0 \quad \text{(Equation 26)}$$

determine $y_1$ and $y_2$ from $$y_1 = x_1 \frac{1}{\gamma} \text{ and } y_2 = x_2 \frac{1}{\beta}$$

Calculate dy from $$dy = V_{p'} y_2 + I_{p'} y_1 \neq 0$$

Case 3. Measured values are: $V_p = 0$; $V_{p'} = 0$, $I_p \neq 0$, and $I_{p'} \neq 0$
$x_1$ is chosen arbitrarily as long as $\neq 0$.

$$y_1 = \frac{1}{\gamma} x$$

Choose $\gamma = 1$. Find $$\frac{1}{\beta} = \frac{I_{p'}}{I_p}$$

$x_2$ is chosen arbitrarily and can=0.

$$y_2 = \frac{1}{\beta} x_2$$

Upon choosing $x_1$ and $x_2$ as prescribed subject to $$dx = V_p x_2 + I_p x_1 \neq 0$$

$$dy = I_{p'} y_1 = \frac{I_p x_1}{\beta \gamma} \neq 0$$

Case 6. Measured values are: $I_p = 0$; $I_{p'} = 0$, $V_p \neq 0$, and $V_{p'} \neq 0$
$x_2$ is chosen arbitrarily and $\neq 0$.

$$y_2 = \frac{1}{\beta} x_2$$

choose $\beta = 1$

Find $$\frac{1}{\gamma} = \frac{V_{p'}}{V_p}$$

$x_1$ is chosen arbitrarily and can=0.

$$y_1 = \frac{1}{\gamma} x_1$$

Upon choosing $x_1$ and $x_2$ as prescribed subject to $$dx = V_p x_2 + I_p x_1 \neq 0$$
$$= V_p x_2 \neq 0$$

$$dy = V_{p'} y_2 + I_{p'} y_1$$
$$= V_{p'} y_2 \neq 0$$

So, three cases align with admissibility for this M type: cases 0, 3, and 6. This can be summarized as follows: (1) for case 0, $\gamma$ is determined from the ratio of $V_p$ to $V_{p'}$ since each is non-zero. $\beta$ is determined, similarly, from the ratio of $I_p$ to $I_{p'}$; (2) for case 3, one simply chooses $\gamma = 1$ since $V_p = V_{p'} = 0$. $\beta$ is calculated as $$\frac{I_p}{I_{p'}},$$

which is the same as for case 0; and (3) for case 6, one simply chooses $\beta = 1$ since $I_p = I_{p'} = 0$. $\gamma$ is calculated as $$\frac{V_p}{V_{p'}},$$

which is also the same as case 0.

$M_2$ as an Upper Triangular Matrix

Where x and y are selected such that $M_2$ is an upper triangular matrix, they must satisfy the following system of equations:

$$\begin{bmatrix} -F_v - \hat{c}I_p & -\hat{c}V_p & V_p & 0 \\ 0 & -F_I & 0 & I_p \\ 0 & F_v & I_p & 0 \\ F_I & 0 & 0 & V_p \end{bmatrix} \begin{bmatrix} x_1 \\ x_2 \\ y_1 - \hat{a}x_1 \\ y_2 - \hat{b}x_2 \end{bmatrix} = \begin{bmatrix} 0 \\ 0 \\ 0 \\ 0 \end{bmatrix}$$

Where $F_v \triangleq V_{p'} - \hat{a}V_p$ and $F_I \triangleq I_{p'} - \hat{b}I_p$ and $$\gamma = \frac{1}{\hat{a}} \text{ and } \beta = \frac{1}{\hat{b}} \text{ and } \hat{c} \triangleq -\frac{\delta}{\gamma\beta}.$$

The given data suggests two cases: cases 1 and 2.
Case 1. The measured data gives:

$V_p=0$ $V_{p'}\neq 0;\ I_p\neq 0;\ I_{p'}\neq 0$

Find:

$$\hat{b} = \frac{I_{p'}}{I_p} \quad \left(\beta = \frac{1}{\hat{b}}\right)$$

$$\hat{c} = \frac{-V_{p'}}{I_p} \quad (\varsigma = -\hat{c}\gamma\beta)$$

Choose $x_1 \neq 0$, but otherwise arbitrary and choose $x_2$ arbitrarily including 0. Choose $\hat{a} \neq 0$, but otherwise arbitrary (here $\hat{a}=1$ is ok)

$$\left(\gamma = \frac{1}{\hat{a}}\right).$$

determine $y_1$ and $y_2$ from $y_1 = \hat{a}x_1 + \hat{c}x_2$ and $y_2 = \hat{b}x_2$ Note:

$dx = I_p x_1 \neq 0$ $dy = \hat{a}\hat{b}dx \neq 0$ $$B_2 = M_2^{-1} = \begin{bmatrix} \hat{a} & \hat{c} \\ 0 & \hat{b} \end{bmatrix} \begin{bmatrix} V_p \\ -I_p \end{bmatrix}$$

Notice that this cannot include the case where $I_p$ and $I_{p'}$ are both zero. This would result in dx=0. Further, even though dy=0 is possible with $I_{p'}\neq 0$, if $I_p=0$ were still to hold, this would result in $-I_{p'}=\hat{b}*0$, $\hat{b}\neq 0$ (a contradiction of terms).

Case 2. Measured values are: $V_{p'}=0$; $V_p\neq 0$, $I_p\neq 0$, and $I_{p'}\neq 0$
Find:

$$\hat{b} = \frac{I_{p'}}{I_p} \quad \left(\beta = \frac{1}{\hat{b}}\right)$$

Choose $\hat{a}\neq 0$, but otherwise arbitrary (here $\hat{a}=1$ is ok)

$$\left(\gamma = \frac{1}{\hat{a}} = 1,\right.$$

here).
Find:

$$\hat{c} = \frac{V_p}{I_p} \quad \left(\hat{c} = -\frac{\varsigma}{\gamma\beta}\right)$$

Choose $x_2=0$.
Determine $y_2 = \hat{b}x_2 = 0$

Choose $x_1\neq 0$, but otherwise arbitrary.
Determine $y_1 = \hat{a}x_1$
$dy = I_p y_1 \neq 0$ and $dx = I_p x_1 \neq 0$ $$B_2 = M_2^{-1} = \begin{bmatrix} \hat{a} & \hat{c} \\ 0 & \hat{b} \end{bmatrix}$$

upper triangular.

Note: as in case 1, one may not include $I_{p'}=I_p=0$ by replacing the first step with simply choosing $\hat{b}=1$. This would result in dy=dx=0 (which is undesired).

So, two cases align with admissibility for this M type: cases 1 and 2. This can be summarized as follows: (1) for case 1, β is determined from the ratio of $I_p$ to $I_{p'}$ since each is non-zero. $\gamma=1$, here. Once β and $\gamma$ are determined, then $$\varsigma = \frac{V_{p'}}{I_p}\beta;$$

and (2) for case 2, β is determined from the ratio of $I_p$ to $I_{p'}$ since each is non-zero, again. $\gamma=1$, again, and $\zeta=$ $$-\frac{V_p}{I_p}\beta,$$

which differs in sign from case 1.

$M_2$ as a Lower Triangular Matrix

Where x and y are selected such that $M_2$ is a lower triangular matrix, they must satisfy the following system of equations:

$$\begin{bmatrix} -F_v & 0 & V_p & 0 \\ -\hat{a}I_p & -F_I - \hat{a}V_p & 0 & I_p \\ 0 & F_v & I_p & 0 \\ F_I & 0 & 0 & V_p \end{bmatrix} \begin{bmatrix} x_1 \\ x_2 \\ y_1 - \hat{a}x_1 \\ y_2 - \hat{b}x_2 \end{bmatrix} = \begin{bmatrix} 0 \\ 0 \\ 0 \\ 0 \end{bmatrix}$$

Where $F_v \triangleq V_{p'} - \hat{a}V_p$ and $F_I \triangleq I_{p'} - \hat{b}I_p$ and $$\gamma = \frac{1}{\hat{a}} \text{ and } \beta = \frac{1}{\hat{b}} \text{ and } \hat{d} = -\frac{\alpha}{\gamma\beta}.$$

The given data suggests two cases: cases 4 and 5.
Case 4. The measured data gives:

$I_p=0$ $I_{p'}\neq 0;\ V_p\neq 0;\ V_{p'}\neq 0$

Find:

$$\hat{a} \triangleq \frac{V_{p'}}{V_p} \quad \left(\gamma = \frac{1}{\hat{a}}\right)$$

Choose $x_2\neq 0$, but otherwise arbitrary and choose $x_1=0$.
determine $y_1 = \hat{a}x_1 = 0$.
Choose $\hat{b}\neq 0$, but otherwise arbitrary. ($\hat{b}=1$ is ok)

$$\left(\beta = \frac{1}{\hat{b}} = 1,\right.$$

here).

Determine $y_2 = \hat{b}x_2$

Determine $$\hat{d} = -\frac{I_{p'}}{V_p}\left(\hat{d} = -\frac{\alpha}{\gamma\beta}\right)$$

$dy = V_p \hat{b} x_2 \neq 0$ and $dx = V_p x_2 \neq 0$ as required.

$$B_2 = M_2^{-1} = \begin{bmatrix} \hat{a} & 0 \\ \hat{d} & 1 \end{bmatrix}$$

Note:

$$\begin{bmatrix} V_{p'} \\ -I_{p'} \end{bmatrix} = \begin{bmatrix} \hat{a} & 0 \\ \hat{d} & 1 \end{bmatrix} \begin{bmatrix} V_p \\ -I_p \end{bmatrix}$$

Note: $V_{p'}=0$ and $V_p=0$ simultaneously may not be included by replacing the first step with a simple choice of $\hat{a}=1$. This would result in $dy=dx=0$.

Case 5. The measured data gives:

$I_p = 0$ $I_{p'} \neq 0;\ V_{p'} \neq 0;\ V_p \neq 0$

Find:

$$\hat{a} = \frac{V_{p'}}{V_p}\left(\gamma = \frac{1}{\hat{a}}\right)$$

Choose $\hat{b} \neq 0$, but otherwise arbitrary ($\hat{b}=1$ is ok)

$$\left(\beta = \frac{1}{\hat{b}} = 1\right).$$

Find $$\hat{d} = \hat{b}\frac{I_{p'}}{V_p}\left(\hat{d} = -\frac{\alpha}{\gamma\beta}\right)$$

Choose $x_1$ arbitrarily, including $x_1=0$.
Choose $x_2$ subject to $\hat{d}x_1 + \hat{b}x_2 \neq 0$.
Determine $y_2 = \hat{d}x_1 + \hat{b}x_2$ and $y_1 = \hat{a}x_1$.
Note:

$$B_2 = M_2^{-1} = \begin{bmatrix} \hat{a} & 0 \\ \hat{d} & \hat{b} \end{bmatrix}$$

Note: $dy = V_p y_2 \neq 0$ and $dx = V_p x_2 + I_p x_1 \neq 0$.
Note: since $$\hat{d} = \hat{b}\frac{I_p}{V_p},$$

then $y_2 = \hat{d}x_1 + \hat{b}x_2$ is equal to $$y_2 = \hat{b}\frac{I_p}{V_p}x_1 + \hat{b}x_2 = \hat{b}(I_p x_1 + V_p x_2).$$

So, $I_p x_1 + V_p x_2 \neq 0 \leftrightarrow y_2 = \hat{d}x_1 + \hat{b}x_2 \neq 0$.

So, two cases align with admissibility for this M type; cases 4 and 5. This can be summarized as follows: (1) for case 4, y is found from the ratio of $V_p$ to $V_{p'}$, each non-zero. $\beta=1$.

$$\alpha = \frac{I_{p'}}{V_p}\gamma$$

once $\beta$ and $\gamma$ are found; and (2) for case 5, $\gamma$ is found from the ratio of $V_p$ to $V_{p'}$. $\beta=1$.

$$\alpha = \left(-\frac{I_p}{V_p}\right)\gamma,$$

once $\beta$ and $\gamma$ are found.

The cases presented above are exemplary in that they demonstrate solutions for the determination of $M_2$ followed by the fact that $d_x$ and $d_y$ meet the requirement of being non-zero.

$$dx = V_p x_2 + I_p x_1 \quad \text{(Equation 27)}$$

And $dx \neq 0$ results. This concludes determination of the $B_2$ matrix.

The method 2300 can construct the N matrix based on the topology of the mutual load and equations 12-15 (Block 2312) (either before, after, or in parallel to finding $B_2$), and then construct the $M_2$ matrix from $B_2^{-1}$ (Block 2314), which concludes the $M_2$ primary extraction phase of the Absolute mutual calibration method. This effectively removes the error represented by the $M_2$ matrix, and now the $M_1$ matrix can be extracted using the Relative method (i.e., these next steps can treat the system as if there is no $M_2$ error matrix).

M1 Secondary Extraction

The $M_1$ matrix can be found via measurements at nodes P', by the reference sensor, and S, by the secondary sensor, as well as via use of the Relative method previously discussed (Block 2316). Said another way, with $M_2$ known, there is a mapping between the reference sensor and the first sensor, and thus the reference sensor and the second sensor can be used in the same way that the Relative method was employed—via two sensors on either side of the mutual load (and only a single error matrix M on either side of the mutual load).

Displacement Matrices and Modified Calibration Matrices

The method 2300 can then calculate the $D_1$ matrix from $M_1$ up to scale factor $k_{pfs}$ (Block 2218) using:

$$D_1 = \Omega M_1 \Omega^{-1} \quad \text{(Equation 28)}$$

Where Ω is given by equation 10. The $D_2$ matrix can be calculated from $M_2$ up to $k_{pfp}$ (Block 2320) using the wave resistance measurements as:

$$D_2 = \Omega M_2 \Omega^{-1} \quad \text{(Equation 29)}$$

Finally, the modified calibration matrices, $K_{s'}$ and $K_{p'}$ can be found as:

$$K_{s'} = K_s D_1 \quad \text{(Equation 30)}$$

$$K_{p'} = K_s D_2 \quad \text{(Equation 31)}$$

(Block 2322). These two modified calibration matrices can be stored in the match memory and the first sensor now reports $V_{p'}$, $I_{p'}$, and the second sensor now reports $V_{s'}$, $I_{s'}$, each of which are removed of error due to the calibration.

The above description of the Absolute method assumes a reference sensor arranged between the first sensor and the mutual load, and is therefore referred to as the first Absolute Method. However, this description can easily be applied to an arrangement with the reference sensor between the second sensor and the mutual load, which can be referred to as the second Absolute method (e.g., see FIGS. 12E and 17).

IV. Details of Calibration Systems

FIG. 8 illustrates an embodiment of a match network during self-calibration of a first of two sensors for determining a first calibration matrix, $K_p$. The match 802 can include any variety of topologies, but for this example a first set of variable components 804 having a complex impedance, $Z_1$, are illustrated along a first electrical path 824 between a match input 828 of the match 802 and the first sensor 806. A second set of variable components 808 having a complex impedance, $Z_2$, can be arranged along a second electrical path between a second sensor 810 and ground. The first sensor 806 can be coupled to a match output 822 and the second sensor 810 can be coupled to a plasma return input 823. A controller 812 can be coupled to the variable components 804, 808 as well as the sensors 806, 810. The controller 812 can also be coupled to a memory 814 including the primary presets 815.

Self-calibration of the first sensor 806 involves coupling a reference power source 816, such as a reference radio frequency (RF) power generator, to the match input 828. A reference sensor 818, or the Standard, is coupled between the first sensor (or its corresponding output) 810 and a self-load 820. The self-load 820 is coupled between the reference sensor 818 and a ground connection. The reference power source 816 can then apply power and the controller 812 can measure parameters of the self-load 820 at three different lab loads with the first sensor 806 and the reference sensor 818. Measurements are taken at these three lab loads to give the values for $w_i$ and $z_i$. Namely, at open, complex impedance $w_1$ and $z_1$ are measured. At short, complex impedance $w_2$ and $z_2$ are measured. At hi phase, complex impedance $w_3$, and $z_3$ are measured. Based on this measuring, the first calibration matrix, $K_p$, can be determined. Specifically, the measured values for $w_1$, $w_2$, and $w_3$ and $z_1$, $z_2$, and $z_3$ are plugged into Equations 2-6 to give the first calibration matrix, $K_p$, and this can be stored in the memory 814.

FIG. 10 shows an embodiment of calibration of the second sensor to obtain the second calibration matrix, $K_s$. This self-calibration accounts for errors between measurements of a second sensor 810 and the reference sensor 818 when the reference sensor 818 is arranged between the second sensor 810 and the self-load 820.

Self-calibration of the second sensor 806 involves coupling a reference power source 1016, such as a reference radio frequency (RF) power generator, to a node 825 between the second set of variable components 808 and the second sensor 810. The reference sensor 818, or the Standard, is coupled between the second sensor 810 or the plasma return input 823, and the self-load 820. The self-load 820 is coupled between the reference sensor 818 and a ground connection. The reference power source 1016 can then apply power and the controller 812 can measure parameters of the self-load 820 with the second sensor 810 and the reference sensor 818. Specifically, the self-load 820 can be set to three lab loads: open, short, and hi phase. Measurements are taken at each of these three lab loads to give the values for $w_i$ and $z_i$. Namely, at open, complex impedances $w_i$ and $z_i$ are measured. At short, complex impedances $w_2$ and $z_2$ are measured. At hi phase, complex impedances $w_3$, and $z_3$ are measured. Based on this measuring, the second calibration matrix, $K_s$, can be determined. Specifically, the measured values for $w_1$, $w_2$, and $w_3$ and $z_1$, $z_2$, and $z_3$ are plugged into Equations 2-6 to give the secondary calibration matrix, $K_s$, and this can be stored in the memory 814 as seen in FIG. 10.

In the above embodiments, the self-load 820 can be a set of one or more reactive and resistive components coupled between the first sensor 806 and ground or between the second sensor 810 and ground during self-calibration. The set of one or more reactive and resistive components of the self-load 820, particularly when used in place of, or in the capacity of, lab loads, can provide a complex impedance seen, during self-calibration, by the match network 802 that is a conjugate match to the match network 802 when the first variable component 804, the second variable component 808, and any other variable components of the match network 802, are set to the presets 815, 817, where the presets 815, 817 provide an impedance match to the mutual load.

FIGS. 13-15 illustrate embodiments of a match network during Relative mutual calibration of the two sensors for determining the displacement matrix, D, and hence the modified second calibration matrix, $K_s^{s'}$ (or $K_{p'}$). The mutual calibration accounts for errors between measurements of the first sensor 806 calibrated by the first calibration matrix, $K_p$, and the second sensor 810 calibrated by the second calibration matrix, $K_s$.

Mutual calibration in FIGS. 13-15 involves coupling a reference power source 816, such as a reference radio frequency (RF) power generator, to the match input 828. The mutual load 1320 is coupled between the first sensor 806 and the second sensor 810. The reference power source 816 can then apply power at the match input 828 and the controller 812 can measure parameters of the mutual load 1320 with the first sensor 806 and the second sensor 810. Specifically, for the presets 815, the first and second sensors 806, 810 can take measurements of current and voltage across (on both sides of) the mutual load 1320. These measurements of $I_p$, $V_p$, $I_s$, and $V_s$, are taken in the environment of the wave resistance, $R_0$, and plugged into Equation 10, which along with the N, B, and M matrices, (see Equations 11, 12, 21) gives the displacement matrix, D, per Equation 9. The displacement matrix, D, can then be multiplied by the self-calibration matrix, $K_s$ (or $K_p$), to give a modified calibration matrix, $K_{s'}$ (or $K_{p'}$). This modified calibration matrix can then be stored in the memory 814 for use during match 802 tuning.

Where a reference sensor 1618 is used (see FIGS. 16-17), the first and second sensors 806, 810 and the reference sensor 1618 can take measurements of current and voltage giving $I_p$, $V_p$, $I_{s'}$, $V_{s'}$, $I_s$, and $V_s$. These measurements are taken in the environment of the wave resistance, $R_0$, and plugged into Equation 10, which along with the N, $B_1$, $B_2$, $M_2$, and $M_2$ matrices, gives the displacement matrices, $D_1$ and $D_2$. The displacement matrices, $D_1$ and $D_2$, can then be multiplied by the self-calibration matrices, $K_s$ and $K_p$, respectively, to give modified calibration matrices, $K_{s'}$ and $K_{p'}$, respectively. These modified calibration matrices can then be stored in the memory 814 for use during match 802 tuning.

The mutual load can be a set of one or more reactive and resistive components coupled between (1) the first sensor 806 and the second sensor 810 during Relative calibration or between (2) the reference sensor and the second sensor 810 during a first Absolute calibration or between (3) the reference sensor and the first sensor 806 during a second Absolute calibration. The set of one or more reactive and resistive components of the mutual load can, during calibration, provide a complex impedance seen by the match network 802 mimicking a complex impedance of the plasma processing chamber 2450 of FIG. 24.

A first set of one or more variable components 804 can be arranged along the first electrical path 824 between the match input 828 and the first sensor 806. These variable components 804 can be part of a set of reactive components in some embodiments, though the topology of the match network 802 will have little influence on the structures and methods highlighted in this disclosure. A second set of one or more variable components 808 can be arranged along the second electrical path 826 between the second sensor 810 and the ground connection. Here too, the second set of one or more variable component 808 can be part of a set of reactive components in some embodiments, but the specific topology of 808 is unlikely to influence the herein disclosed systems and methods for sensor calibration.

The variable components 804, 808 can take a variety of forms. One non-limiting example is shown in FIGS. 9 and 11, where a specific EL topology is shown for different self-calibration and mutual calibration setups.

Verification or Power Correction

A verification can be performed after every self-calibration and after every mutual calibration. Verification involves checking the voltage and current with the Standard and the modified self-calibration matrix, or $K_sD$ or $K_pD$, loaded into the controller 812. A scaling factor or scaler, k, can be applied to the modified self-calibration matrix, $K_{s'}$ or $K_{p'}$, until the values measured by the Standard are seen to agree with those reported by the match network 802.

Complex Wave Impedance

When greater accuracy and broader application are desired, the self-calibration matrices, $K_p$ and $K_s$, can be determined using a complex impedance $Z_0$ environment, rather than a real wave resistance, $R_0$. Converting any of the impedance measurements, $w_i$ or $z_i$, to a complex form can be done using the following equation:

$$\hat{\beta}_l = \frac{R_o(1+\beta_l) - \overline{Z_o}(1-\beta_l)}{Z_o(1-\beta_l) + R_o(1+\beta_l)} \quad \text{(Equation 32)}$$

where $\beta_l$ can represent either $w_i$, or $z_i$ under the real resistance environment, $R_0$; while $\hat{\beta}_l$ then represents, either $w_i$, or $z_i$ under the complex impedance environment, $Z_0$, respectively. More specifically, $$\beta_l = \frac{Z_l - R_o}{Z_l + R_o} \quad \text{(Equation 33)}$$

where, $R_0$ is a real number, and $$\hat{\beta}_l = \frac{Z_l - \overline{Z_o}}{Z_l + Z_o} \quad \text{(Equation 34)}$$

where, $Z_0$ is a complex number representing the complex wave impedance (expressed as $Z_0 = R_0 + jx_0$). The subscript, l, is an integer in the range of 1, 2, or 3. Thus, a self-calibration matrix or mutual calibration matrix based on real impedance can be converted to a self-calibration matrix based on complex impedance.

Along these lines, Equation 9 for the displacement matrix, D, can be rewritten as:

$$D = \hat{\Omega} M \hat{\Omega}^{-1} \quad \text{(Equation 35)}$$

Where $\Omega$ is defined as $$\hat{\Omega} \triangleq \frac{1}{2} \begin{bmatrix} 1 & Z_0 \\ 1 & -\overline{Z_0} \end{bmatrix} \quad \text{(Equation 36)}$$

And where $Z_0$ is complex impedance. Using equations 35 and 36, all of the above discussions of determining the calibration matrices and modified calibration matrices can be performed in a complex impedance space rather than real impedance space.

VI. Details of Sensors in Use

Figure 24:
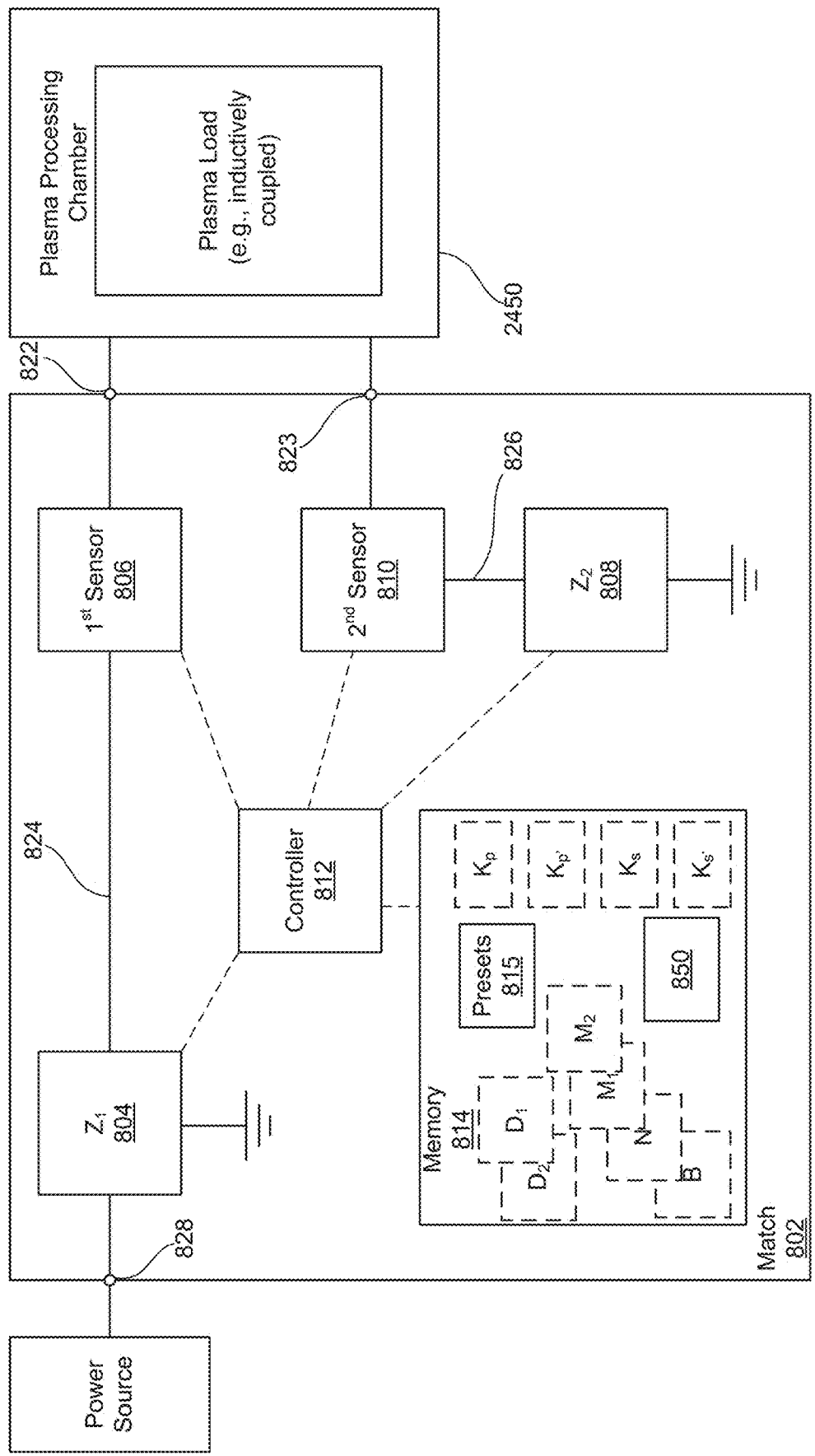
FIG. 24 illustrates an embodiment of a plasma processing system implementing a match network that tunes based on sensors calibrated according to embodiments of this disclosure.

With (1) one of the self-calibration matrices, $K_p$ or $K_s$, and a modified self-calibration matrix, $K_{s'}$ or $K_{p'}$, stored in the memory 814 (Relative method) or (2) both modified self-calibration matrices $K_{s'}$ or $K_{p'}$ stored in the memory 814 (Absolute method), the match network 802 is ready for field deployment as shown in FIG. 24. To this end, the match network 802 can be coupled to a plasma processing chamber 2450 and the variable elements 804 and 808 can be set to the presets 815 (Block 1812 in FIG. 18). More specifically, and as seen in FIG. 12, the output 822 of the match network 802 as well as the plasma return input 823 can be coupled to a plasma processing chamber 2450. The chamber 2450 can include a plasma load, such as an inductively coupled plasma load. A match network 802 tuning algorithm 850, also stored in the memory 814, can be used by the controller 812 in combination with data returned from the sensors 806 and 810, and calibrated by the matrices, $K_p$ and $K_s$, or $K_{p'}$ and $K_s$, or $K_{p'}$ and $K_{s'}$, to tune the variable elements 804 and 808 to achieve a match with the plasma processing chamber 2450 (Block 1814). Since power delivery to the plasma processing chamber is the primary concern of the match network 802, feedback from the first sensor 806 may be given priority at the controller 812 for tuning over that from the second sensor 810.

The controller 812 can be configured to monitor power delivery to the plasma processing chamber 2450 via the first and second sensors 806, 810, wherein data from the first sensor 806 is calibrated (e.g., corrects errors) via the first self-calibration matrix, $K_p$, and data from the second sensor 810 is calibrated (e.g., corrects errors) via the modified second self-calibration matrix, $K_{s'}$ (first Relative method). Alternatively, data from the second sensor 810 is calibrated via the second self-calibration matrix, $K_s$, and data from the first sensor 806 is calibrated via the modified first self-calibration matrix, $K_{p'}$ (second Relative method). Alternatively, data from the second sensor 810 is calibrated via the second modified self-calibration matrix, $K_{s'}$, and data from the first sensor 806 is calibrated via the modified first self-calibration matrix, $K_{p'}$ (Absolute method).

Based on feedback from the calibrated sensors 806, 810, the controller 812 instructs one or more of the variable components 804, 808 to adjust to better deliver power to the plasma processing chamber 2450.

The modified second self-calibration matrix, $K_{s'}$, can account for errors between the first and second sensors 806, 810 when used together to measure opposing sides of a mutual load, and after calibration of the first and second sensors 806, 810 in isolation (i.e., after self-calibration).

The first self-calibration matrix, $K_p$, can account for errors between measurements of the first sensor 806 and the reference sensor during self-calibration when both the first sensor 806 and the reference sensor measure current and voltage delivered through the match network 802 output 822 to a self-load.

The second self-calibration matrix, $K_p$, can account for errors between measurements of the second sensor 810 and the reference sensor during self-calibration when both the second sensor 810 and the reference sensor measure current and voltage delivered through the plasma return input 823 to a self-load.

The modified first self-calibration matrix, $K_{p'}$, can account for errors between the first and second sensors 806, 810 when used together to measure opposing sides of the mutual load, and after calibration of the first and second sensors 806, 810 in isolation (i.e., after self-calibration).

VII. Application to Single-Output Topologies

Although this disclosure focuses on ideas that were developed for and in the context of challenges that arose in dual-output match networks, the solutions proved equally revolutionary to certain aspects of single-output calibration (and certainly would not have been discovered had one simply focused on single-output challenges). For one, using a complex impedance environment rather than a real impedance environment to perform self-calibration opens up more accurate and more widely applicable uses of the self-calibrated sensors.

VIII. Multiple Generator Topologies

In some cases, two or more pairs of RF generator and match network can be used to provide power to the plasma processing chamber. The output(s) of the match network may be provided to electrodes in the chamber responsible for ignition and sustaining of the plasma and/or to electrodes responsible for applying a bias to a chucked substrate. Moreover, there may be one or more generators, and each generator may have a distinct match network, each of these match networks using sensors calibrated as described above. Some non-limiting example systems of generator(s), match(s), and processing chamber, can be seen in FIG. 2.

Figure 25:
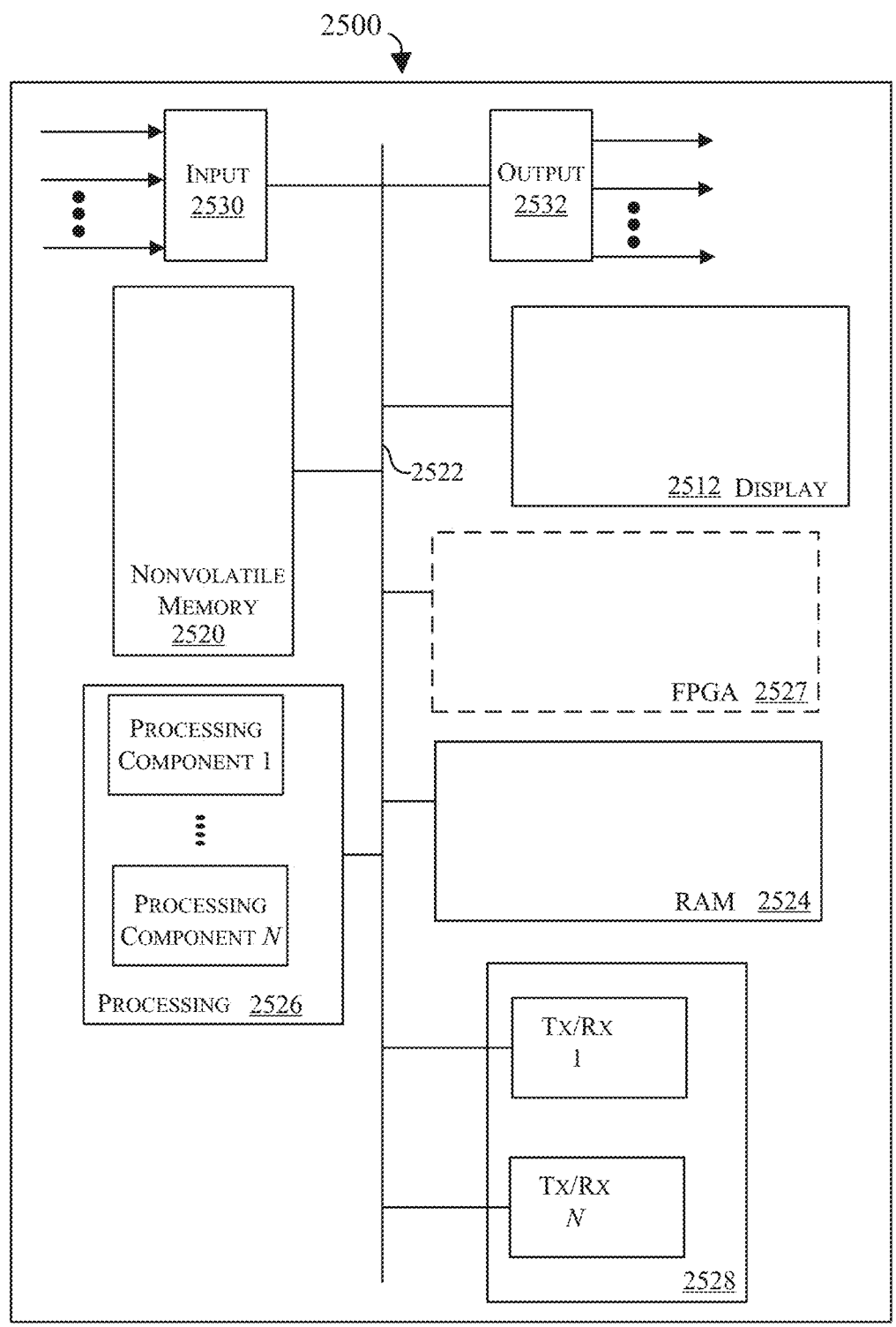
FIG. 25 is a block diagram depicting physical components that may be utilized to realize the match network 802 (and the controller 812 generally).

The methods described in connection with the embodiments disclosed herein may be embodied directly in hardware, in processor-executable code encoded in a non-transitory tangible processor readable storage medium, or in a combination of the two. Referring to FIG. 25 for example, shown is a block diagram depicting physical components that may be utilized to realize the match network 802 (and the controller 812 generally) according to an exemplary embodiment. As shown, in this embodiment a display portion 2512 and nonvolatile memory 2520 are coupled to a bus 2522 that is also coupled to random access memory ("RAM") 2524, a processing portion (which includes N processing components) 2526, an optional field programmable gate array (FPGA) 2527, and a transceiver component 2528 that includes N transceivers. Although the components depicted in FIG. 25 represent physical components, FIG. 25 is not intended to be a detailed hardware diagram; thus, many of the components depicted in FIG. 25 may be realized by common constructs or distributed among additional physical components. Moreover, it is contemplated that other existing and yet-to-be developed physical components and architectures may be utilized to implement the functional components described with reference to FIG. 25.

This display portion 2512 generally operates to provide a user interface for a user, and in several implementations, the display is realized by a touchscreen display. In general, the nonvolatile memory 2520 is non-transitory memory that functions to store (e.g., persistently store) data and processor-executable code (including executable code that is associated with effectuating the methods described herein). In some embodiments for example, the nonvolatile memory 2520 includes bootloader code, operating system code, file system code, and non-transitory processor-executable code to facilitate the execution of a method described with reference to any of FIGS. 18-23 described further herein.

In many implementations, the nonvolatile memory 2520 is realized by flash memory (e.g., NAND or ONENAND memory), but it is contemplated that other memory types may be utilized as well. Although it may be possible to execute the code from the nonvolatile memory 2520, the executable code in the nonvolatile memory is typically loaded into RAM 2524 and executed by one or more of the N processing components in the processing portion 2526.

The N processing components in connection with RAM 2524 generally operate to execute the instructions stored in nonvolatile memory 2520 to enable self-calibration and mutual calibration, and match tuning using first and second sensors calibrated via either Relative or Absolute mutual calibration. For example, non-transitory, processor-executable code to effectuate the methods described with reference to FIGS. 18-23 may be persistently stored in nonvolatile memory 2520 and executed by the N processing components in connection with RAM 2524. As one of ordinarily skill in the art will appreciate, the processing portion 2526 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 2526 may be configured to effectuate one or more aspects of the self- and mutual calibration methodologies described herein (e.g., the methods described with reference to FIGS. 18-23). For example, non-transitory processor-readable instructions may be stored in the nonvolatile memory 2520 or in RAM 2524 and when executed on the processing portion 2526, cause the processing portion 2526 to perform self-calibration with a self-load, mutual calibration with a mutual load, and match tuning with a plasma processing chamber using sensors calibrated via Relative or Absolute mutual calibration. Alternatively, non-transitory FPGA-configuration-instructions may be persistently stored in non-volatile memory 2520 and accessed by the processing portion 2526 (e.g., during boot up) to configure the hardware-configurable portions of the processing portion 2526 to effectuate the functions of the match network 802 and/or controller 812.

The input component 2530 operates to receive signals (e.g., the measurements of current and voltage at the first and second sensor and optionally the Standard) that are indicative of one or more aspects of the match network power delivery. The signals received at the input component may include, for example, current or voltage at the output 822, or current or voltage at the plasma return input 823. The output component generally operates to provide one or more analog or digital signals to effectuate an operational aspect of the calibration or match tuning. For example, the output portion 2532 may provide the instructions to the variable components 804, 808 to adjust to the presets or to adjust to optimize power delivery during plasma processing.

The depicted transceiver component 2528 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed:

1. A match network configured for impedance matching a radio frequency power generator to a plasma processing chamber, the match network comprising:
    a match input;
    an output; and
    a plasma return input;
    a first sensor coupled to a first electrical path between the match input and the output;
    a second sensor coupled to a second electrical path between the plasma return input and a ground connection;
    a memory storing a first calibration matrix, $K_1$, a second calibration matrix, $K_2$, and a modified second calibration matrix, $K_{2'}$;
    a controller configured to monitor power delivery to the plasma processing chamber via the first and second sensors, wherein data from the first or second sensor is calibrated via the first calibration matrix, $K_1$, and data from the second or first sensor, respectively, is calibrated via the modified second calibration matrix, $K_{2'}$,
    wherein the modified second calibration matrix, $K_{2'}$, accounts for errors between the first and second sensors when the first and second sensors are calibrated by measuring current and voltage at the output and the plasma return input with a mutual load coupled between the first and second sensors.

2. The match network of claim 1, wherein the modified second calibration matrix, $K_{2'}$, accounts for errors between the first and second sensors after the first sensor is calibrated in isolation against a primary self-load to give the first calibration matrix, $K_1$, and the second sensor is calibrated in isolation against a secondary self-load to give the second calibration matrix, $K_2$.

3. The match network of claim 2, wherein the first calibration matrix, $K_1$, accounts for errors between measurements of the first sensor and a reference sensor when both the first sensor and the reference sensor are measuring current and voltage delivered through the match network via the output to the primary self-load.

4. The match network of claim 3, wherein the primary self-load is a set of one or more reactive and resistive components coupled between the first sensor and ground during determination of the first calibration matrix, $K_1$, and selected as a conjugate match to the output, and wherein the mutual load is a set of one or more reactive and resistive components coupled between the first sensor and the second sensor during mutual calibration and configured to provide a complex impedance to the match network that is a conjugate match to the match network and matches a reference load.

5. The match network of claim 1, wherein the modified second calibration matrix, $K_{2'}$, accounts for errors between the first and second sensors after the first sensor is calibrated in isolation against a secondary self-load to give the first calibration matrix, $K_1$, and the second sensor is calibrated in isolation against a primary self-load to give the second calibration matrix, $K_2$.

6. The match network of claim 5, wherein the first calibration matrix, $K_1$, accounts for errors between measurements of the second sensor and a reference sensor when both the second sensor and the reference sensor are measuring current and voltage delivered through the match network via the plasma return input to the secondary self-load.

7. The match network of claim 6, wherein the secondary self-load is a set of one or more reactive and resistive components coupled between the second sensor and ground during determination of the first calibration matrix, $K_1$, and selected as a conjugate match to the output, and wherein the mutual load is a set of one or more reactive and resistive components coupled between the first sensor and the second sensor during mutual calibration and configured to provide a complex impedance to the match network matching a reference load.

8. The match network of claim 1, wherein the first calibration matrix, $K_1$, and the modified second calibration matrix, $K_{2'}$, are determined as a function of complex impedance, $z_0 = R_0 + jx_0$.

9. The match network of claim 1, wherein the modified second calibration matrix, $K_{2'}$ is found as $K_2 D$, wherein D is a displacement calibration matrix that accounts for errors between the first and second sensors when the first and second sensors are calibrated by measuring current and voltage at the match output and plasma return input with a mutual load coupled between the first and second sensors.

10. The match network of claim 1, wherein the first calibration matrix, $K_1$, the second calibration matrix, $K_2$, and the modified second calibration matrix, $K_{2'}$, are all determined with the match network at the same variable component values.

11. A match network configured for impedance matching a radio frequency power generator to a plasma processing chamber, the match network comprising:
 a match input;
 an output; and
 a plasma return input;
 a first sensor coupled to a first electrical path between the match input and the output;
 a second sensor coupled to a second electrical path between the plasma return input and a ground connection;
 a memory storing a first calibration matrix, $K_1$, a second calibration matrix, $K_2$, a first modified calibration matrix, $K_{1'}$, and a second modified calibration matrix, $K_{2'}$;
 a controller configured to monitor power delivery to the plasma processing chamber via the first and second sensors, wherein data from the first sensor is calibrated via a first modified calibration matrix, $K_{1'}$, and data from the second sensor is calibrated via a second modified calibration matrix, $K_{2'}$,
 wherein the modified first calibration matrix, $K_{1'}$, and the modified second calibration matrix, $K_{2'}$, account for errors between the first and second sensors when the first and second sensors are individually calibrated via a reference sensor and a self-load, and then mutually calibrated against each other via (1) measurements of current and voltage at the match output by the first sensor and the reference sensor or (2) measurements of current and voltage at the plasma return input by the second sensor and the reference sensor.

12. The match network of claim 11, wherein the first and second modified calibration matrices, $K_{1'}$ and $K_{2'}$, account for errors between the first and second sensors after the first sensor is calibrated in isolation against a primary self-load to give the first calibration matrix, $K_1$, and the second sensor is calibrated in isolation against a secondary self-load to give the second calibration matrix, $K_2$.

13. The match network of claim 12, wherein the first calibration matrix, $K_1$, accounts for errors between measurements of the first sensor and the reference sensor when both the first sensor and the reference sensor are measuring current and voltage delivered through the match network via the output to the primary self-load.

14. The match network of claim 13, wherein the primary self-load is a set of one or more reactive and resistive components coupled between the first sensor and ground during determination of the first calibration matrix, $K_1$, and selected as a conjugate match to the output, and wherein the mutual load is a set of one or more reactive and resistive components coupled between the first sensor and the second sensor during mutual calibration and configured to provide a complex impedance to the match network that is a conjugate match to the match network and matches a reference load.

15. The match network of claim 12, wherein the first calibration matrix, $K_1$, accounts for errors between measurements of the second sensor and a reference sensor when both the second sensor and the reference sensor are measuring current and voltage delivered through the match network via the plasma return input to the secondary self-load.

16. The match network of claim 11, wherein the first and second calibration matrices, $K_1$ and $K_2$, and the modified first and second calibration matrices, $K_{1'}$ and $K_{2'}$, are determined as a function of complex impedance, $z_0 = R_0 + jx_0$.

17. The match network of claim 16, wherein the secondary self-load is a set of one or more reactive and resistive components coupled between the second sensor and ground during determination of the first calibration matrix, $K_1$, and selected as a conjugate match to the output, and wherein the mutual load is a set of one or more reactive and resistive components coupled between the first sensor and the second sensor during mutual calibration and configured to provide a complex impedance to the match network matching a reference load.

18. The match network of claim 11, wherein the first and second calibration matrices, $K_1$ and $K_2$, and the modified first and second calibration matrices, $K_{1'}$ and $K_{2'}$, are determined with the match network at the same variable component values.

19. The match network of claim 11, wherein the first modified calibration matrix, $K_{1'}$, is formed from a first displacement matrix, $D_1$, as $K_{1'} = K_1 D_1$, where the first displacement matrix, $D_1$, is formed from an $M_1$ matrix representing errors between measurements of current and voltage taken by (1) the first sensor and the reference sensor, and an N matrix representing the mutual load; or (2) the second sensor and the reference sensor, and the N matrix representing the mutual load.

20. The match network of claim 19, wherein the second modified calibration matrix, $K_{2'}$, is formed from a second displacement matrix, $D_2$, as $K_{2'} = K_2 D_2$ where the second displacement matrix, $D_2$, is formed from an $M_2$ matrix representing errors between measurements of current and voltage taken by (1) the second sensor and the reference sensor, and an N matrix representing the mutual load; or (2) the first sensor and the reference sensor, and the N matrix representing the mutual load.

* * * * *